(12) United States Patent
Yoneda et al.

(10) Patent No.: US 8,115,256 B2
(45) Date of Patent: Feb. 14, 2012

(54) SEMICONDUCTOR DEVICE

(75) Inventors: Haruki Yoneda, Ogaki (JP); Hideaki Fujiwara, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 801 days.

(21) Appl. No.: 11/849,042

(22) Filed: Aug. 31, 2007

(65) Prior Publication Data

US 2008/0258231 A1 Oct. 23, 2008

(30) Foreign Application Priority Data

Aug. 31, 2006 (JP) ................................. 2006-234898
Aug. 1, 2007 (JP) ................................. 2007-201225

(51) Int. Cl.
*H01L 21/70* (2006.01)

(52) U.S. Cl. ........ 257/368; 257/370; 257/378; 257/499; 257/511; 257/517; 257/525; 257/555; 257/562; 257/577; 257/E27.109; 257/E21.382; 257/E21.695; 257/E21.696; 257/E29.184; 257/E29.185; 438/151; 438/153; 438/154; 438/158; 438/170; 438/188; 438/189; 438/199; 438/202; 438/234; 438/315; 438/334; 327/389; 327/391; 327/394; 327/404; 327/408; 327/415; 327/429; 327/437; 327/450; 327/581

(58) Field of Classification Search .................. 257/124, 257/133, 134, 137, 140, 146, 163, 167, 256, 257/262, 265, 267, 270, 272, 273, 274, 288, 257/350, 368–370, 378, 499, 511, 517, 525, 257/555, 565, 577, E27.109, E21.382, E21.695, 257/E21.696, E29.184, E29.185, E29.197, 257/E29.199, E29.291, E29.294; 438/151–154, 438/158, 170, 188, 189, 199, 200, 202, 203, 438/234, 309, 314, 315, 326, 334; 327/389, 327/391, 394, 404, 405, 408–413, 415, 419, 327/427, 429–434, 437, 438, 450, 459, 462, 327/467, 474, 478, 479, 564, 466, 581
See application file for complete search history.

(56) References Cited

U.S. PATENT DOCUMENTS 4,868,135 A * 9/1989 Ogura et al. .................. 438/203
(Continued)

FOREIGN PATENT DOCUMENTS

JP 61-245563 A 10/1986
(Continued)

OTHER PUBLICATIONS

Japanese Office Action, 2007-201225, Ref. NPC1070074, Oct. 28, 2008, 9P, Japan Patent Office, Japan.

*Primary Examiner* — Meiya Li
(74) *Attorney, Agent, or Firm* — Ditthavong Mori & Steiner, P.C.

(57) ABSTRACT

A semiconductor device includes an inverter having an NMOSFET and a PMOSFET having sources, drains and gate electrodes respectively, the drains being connected to each other and the gate electrodes being connected to each other, and a pnp bipolar transistor including a collector (C), a base (B) and an emitter (E), the base (B) receiving an output of the inverter.

13 Claims, 15 Drawing Sheets

U.S. PATENT DOCUMENTS

| | | | |
|---|---|---|---|
| 5,119,160 A * | 6/1992 | Hall | 257/370 |
| 5,156,989 A * | 10/1992 | Williams et al. | 438/206 |
| 5,172,209 A * | 12/1992 | Chang | 257/368 |
| 5,198,691 A * | 3/1993 | Tarng | 257/316 |
| 5,376,816 A * | 12/1994 | Nishigoori et al. | 257/370 |
| 5,441,903 A | 8/1995 | Eklund | |
| 6,242,967 B1 | 6/2001 | Iwamuro et al. | |
| 2002/0053717 A1 * | 5/2002 | Sumida | 257/565 |
| 2005/0056906 A1 * | 3/2005 | Jimbo et al. | 257/492 |

FOREIGN PATENT DOCUMENTS

| | | |
|---|---|---|
| JP | 04-180260 A | 6/1992 |
| JP | 04-207068 A | 7/1992 |
| JP | 07-321240 A | 8/1995 |
| JP | 11-330455 | 11/1999 |
| JP | 11-354657 | 12/1999 |

* cited by examiner

SEMICONDUCTOR DEVICE

CROSS-REFERENCE TO RELATED APPLICATIONS

The priority application numbers JP2006-234898, Semiconductor Device, Aug. 31, 2006, Haruki Yoneda, Hideaki Fujiwara, JP2007-201225, Semiconductor Device, Aug. 1, 2007, Haruki Yoneda, Hideaki Fujiwara, upon which this patent application is based are hereby incorporated by reference.

BACKGROUND OF THE INVENTION

1. Field of the Invention

The present invention relates to a semiconductor device.

2. Description of the Background Art

There are mainly a current-driven semiconductor such as a bipolar transistor and a voltage-driven semiconductor such as an insulated gate field-effect transistor (MOSFET) in a conventional semiconductor device.

While a greatest advantage of the bipolar transistor is to keep an ON-state resistance low by conductivity modulation, the bipolar transistor disadvantageously has difficult controllability and can not turn off at a high speed. On the other hand, while the MOSFET advantageously has excellent controllability and can turn off at a high speed, an ON-state resistance is disadvantageously increased when the MOSFET tries to have a high breakdown voltage capability.

An insulated gate bipolar transistor (IGBT) used since the 1980's is a bipolar device controlled by a MOS gate and has a structure in which a p-type collector layer is added to a side of an n-type drain layer of a vertical power MOSFET. Thus, controllability by voltage drive and a low ON-state resistance by double injection of carriers can be simultaneously achieved, however, high speed turning off is disadvantageously difficult.

In this regard, as a technique of simultaneously achieving the high speed turning off and the low ON-state resistance, there is a semiconductor device combined with the MOSFET and the bipolar transistor. This conventional semiconductor device comprises an npn bipolar transistor, an NMOSFET and a PMOSFET. A source and a drain of the NMOSFET are connected to a base and a collector of the bipolar transistor respectively. A source and a drain of the PMOSFET are connected to the base and an emitter of the bipolar transistor. The source of the NMOSFET is connected to the source of the PMOSFET. The gate of the NMOSFET and the gate of the PMOSFET are electrically connected to a gate terminal. In this semiconductor device, when the gate terminal is high, the NMOSFET is turned on, thereby turning on the bipolar transistor. Thus, an ON-state resistance is made lower. When the NMOSFET is in an OFF-state, the PMOSFET is turned on, whereby carriers stored at a time of an ON-state can be pulled out from the bipolar transistor. Thus, the high speed turning off can be achieved.

In the aforementioned semiconductor device combined with the NMOSFET, PMOSFET and the bipolar transistor, however, the sources of the NMOSFET and the PMOSFET are connected to the base of the bipolar transistor and hence the threshold voltages of the NMOSFET and the PMOSFET are disadvantageously unstabilized. Thus, an operation of the semiconductor device is disadvantageously unstabilized. Additionally, all terminals can not be formed on one surface because of a wiring structure, and hence integration with other devices is disadvantageously difficult.

SUMMARY OF THE INVENTION

A semiconductor device according to a first aspect of the present invention comprises an inverter including a first conductive type first field-effect transistor and a second conductive type second field-effect transistor including sources, drains and gate electrodes respectively, the drains being connected to each other and the gate electrodes being connected to each other, and a bipolar transistor including a collector, a base and an emitter, the base receiving an output of the inverter.

A semiconductor device according to a second aspect of the present invention comprises an inverter including a first conductive type first field-effect transistor and a second conductive type second field-effect transistor including sources, drains and gate electrodes respectively, the drains being connected to each other and the gate electrodes being connected to each other, and a bipolar transistor including a collector, a base and an emitter, the base receiving an output of the inverter, wherein a first impurity region constituting the drain of either the first conductive type first field-effect transistor or the second conductive type second field-effect transistor and a second impurity region constituting the base of the bipolar transistor are so formed as to be in direct contact with each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

A structure of a semiconductor device according to a first embodiment of the present invention will be now described with reference to FIGS. 1 to 4.

Figure 1:
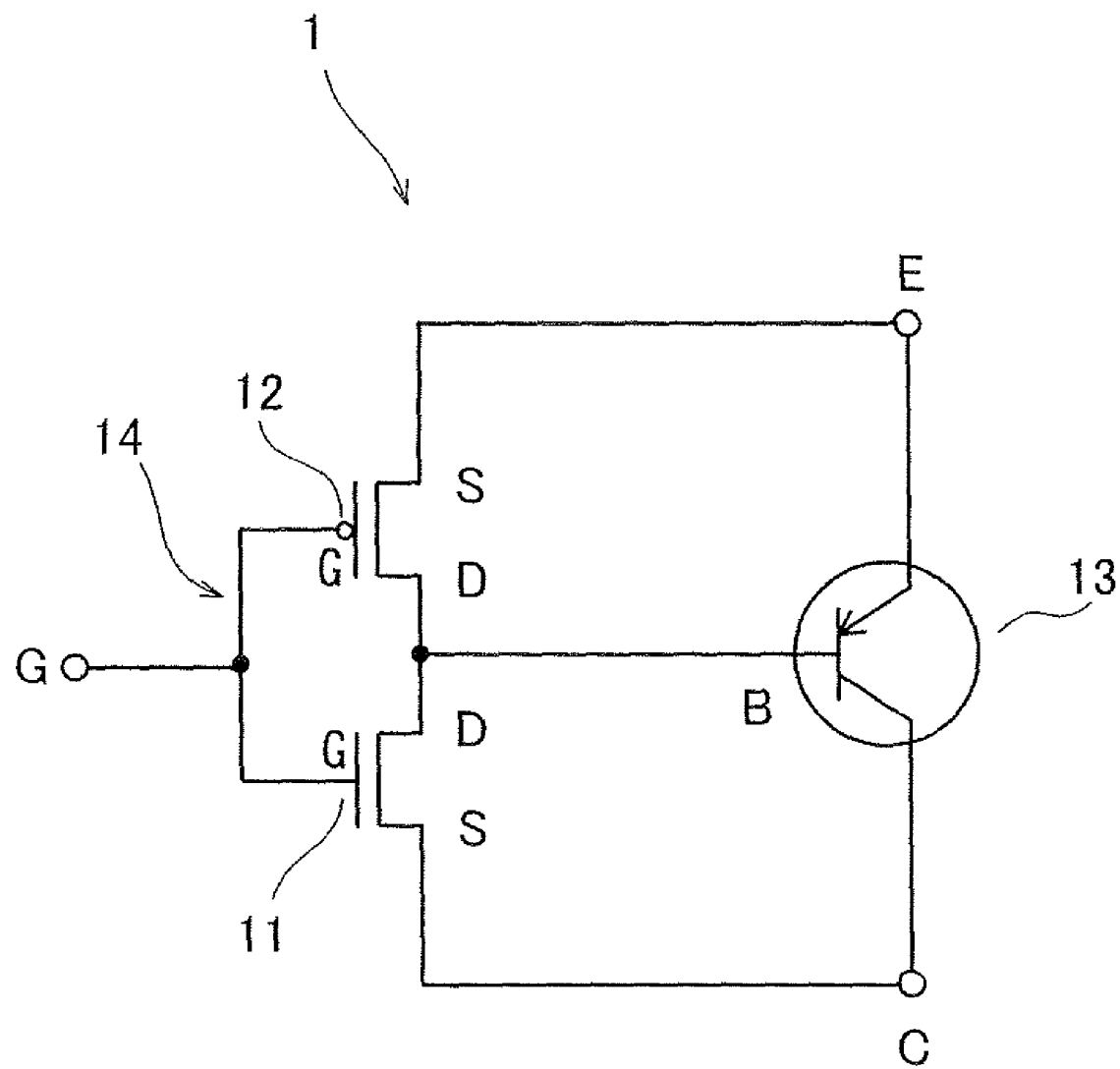
FIG. 1 is a circuit diagram of a semiconductor device according to a first embodiment of the present invention.

A semiconductor device 1 according to the first embodiment is constituted by an NMOSFET 11, a PMOSFET 12 and a pnp bipolar transistor 13 as shown in FIG. 1. The NMOSFET 11 is an example of the "first conductive type first field-effect transistor" in the present invention, and the PMOSFET 12 is an example of the "second conductive type second field-effect transistor" in the present invention. A source of the NMOSFET 11 and a collector (C) of the pnp bipolar transistor are electrically connected to each other. A source of the PMOSFET 12 and an emitter (E) of the pnp bipolar transistor 13 are electrically connected to each other. A drain of the NMOSFET 11 and a drain of the PMOSFET 12 are connected to a base (B) of the pnp bipolar transistor. A gate of the NMOSFET 11 and a gate of the PMOSFET 12 are connected to a gate terminal (G). The drain of the NMOSFET 11 and the drain of the PMOSFET 12 are connected to each other and the NMOSFET 11 and the PMOSFET 12 constitute an inverter 14. The base (B) of the pnp bipolar transistor 13 receives an output of the inverter 14. An output signal of the semiconductor device 1 is outputted from the source of the NMOSFET 11 and the collector (C) of the pnp bipolar transistor 13.

Figure 2:
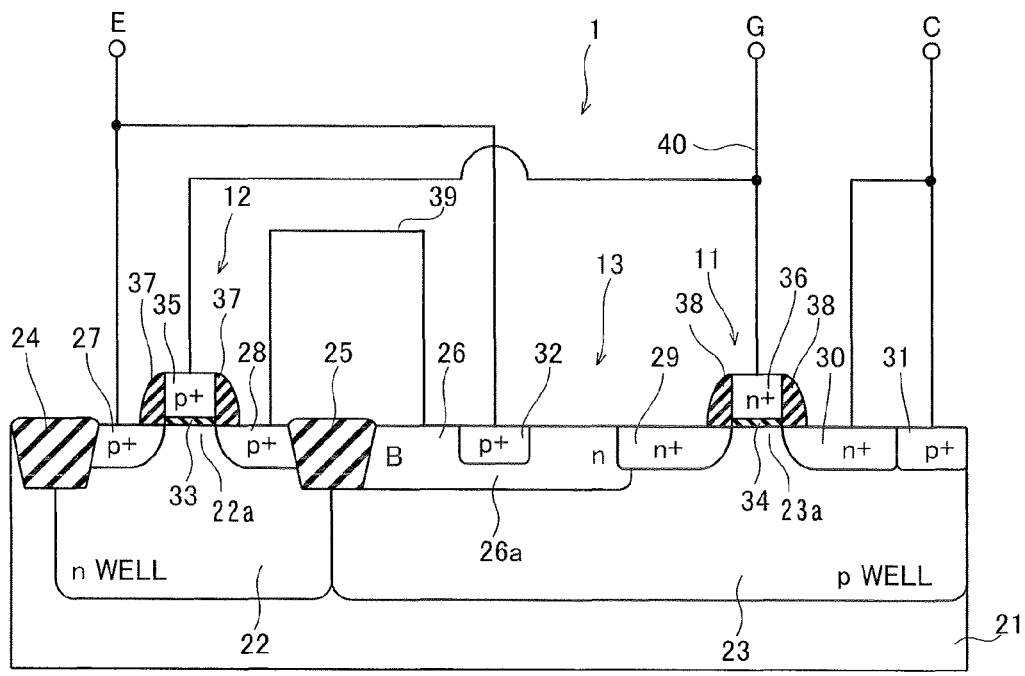
FIG. 2 is a sectional view of the semiconductor device according to the first embodiment shown in FIG. 1.

Referring to a cross-sectional structure of the semiconductor device according to the first embodiment, as shown in FIG. 2, an n well 22, a p well 23 and element isolation oxide films 24 and 25 are formed on a main surface of the p-type silicon substrate 21. A p$^+$ source region 27 and a p$^+$ drain region 28 are so formed on a surface of the n well 22 at a prescribed interval as to hold a channel region 22a therebetween. The p$^+$ source region 27 and the p$^+$ drain region 28 function as the source and the drain of the PMOSFET 12 respectively. The p$^+$ source region 27 and the p$^+$ drain region 28 may be so formed as to have a LDD (lightly doped drain) structure. A p$^+$-type gate electrode 35 consisting of polysilicon doped with a p-type impurity is formed on the channel region 22a through a gate oxide film 33. The p$^+$ source region 27, the p$^+$ drain region 28, the channel region 22a and the p$^+$ type gate electrode 35 constitute the PMOSFET 12. A side wall spacer 37 consisting of HTO (high temperature oxide) and the like is formed on side surfaces of the p$^+$ type gate electrode 35. The p-type silicon substrate 21 and the p well 23 are examples of the "semiconductor substrate" and the "first well region" in the present invention respectively.

An n+ drain region 29 and an n+ source region 30 are so formed on a surface of the p well 23 at a prescribed interval as to hold a channel region 23a therebetween. The n+ drain region 29 and the n+ source region 30 function as the drain and the source of the NMOSFET 11 respectively. The n+ drain region 29 and the n+ source region 30 are so formed as to have a LDD (lightly doped drain) structure. An n+-type gate electrode 36 consisting of polysilicon doped with an n-type impurity is formed on the channel region 23a through a gate oxide film 34. The n+ drain region 29, the n+ source region 30, the channel region 23a, the n+-type gate electrode 36 constitute the NMOSFET 11. A side wall spacer 38 consisting of HTO (high temperature oxide) is formed on side surfaces of the n+ type gate electrode 36. The n+ drain region 29 is an example of the "first impurity region" in the present invention.

An n-type base layer 26 and a p$^+$ collector layer 31 of the pnp bipolar transistor 13 are so formed on the surface of the p well 23 as to hold the n$^+$ drain region 29 and the n$^+$ source region 30 of the NMOSFET 11. The n-type base layer 26 is so formed as to be continuous to the n$^+$ drain region 29 of the NMOSFET 11 and the p$^+$ collector layer 31 is so formed as to be adjacent to the n$^+$ source region 30 of the NMOSFET 11. A p$^+$ emitter layer 32 of the pnp bipolar transistor 13 is formed on a surface of the n-type base layer 26. Thus, according to this embodiment, all terminals of the n$^+$ drain region 29, the n$^+$ source region 30 and the n$^+$-type gate electrode 36 of the NMOSFET 11, the p$^+$ source region 27, the p$^+$ drain region 28 and the p$^+$ type gate electrode 35 of the PMOSFET 12 and the n-type base layer 26, the p$^+$ collector layer 31 and the p$^+$ emitter layer 32 of the pnp bipolar transistor 13 are formed on the main surface of the p-type silicon substrate 21. The n-type base layer 26 and the p$^+$ collector layer 31 are examples of the "second impurity region" and the "first collector extraction region" in the present invention respectively.

Figure 3:
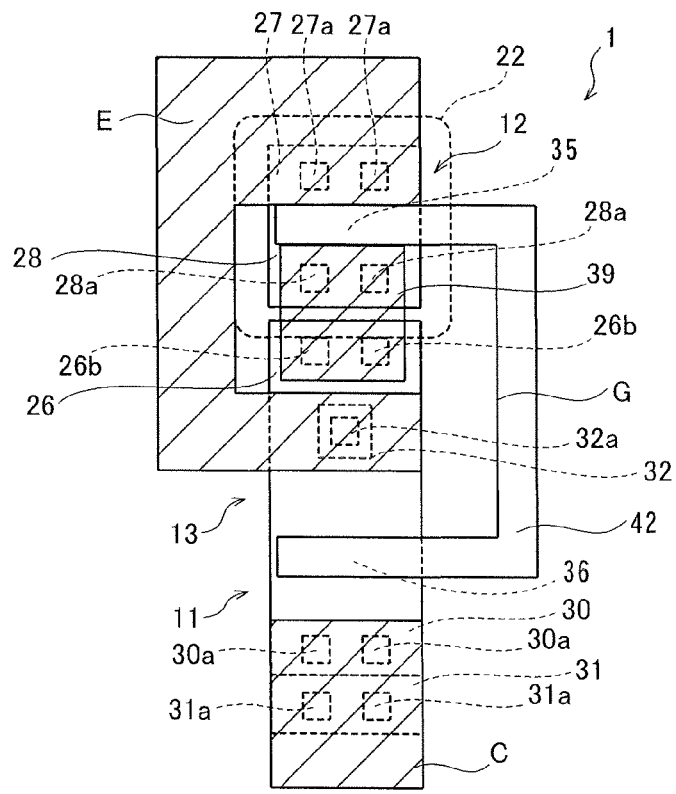
FIG. 3 is an electrode arrangement diagram of the semiconductor device according to the first embodiment shown in FIG. 1.
Figure 4:
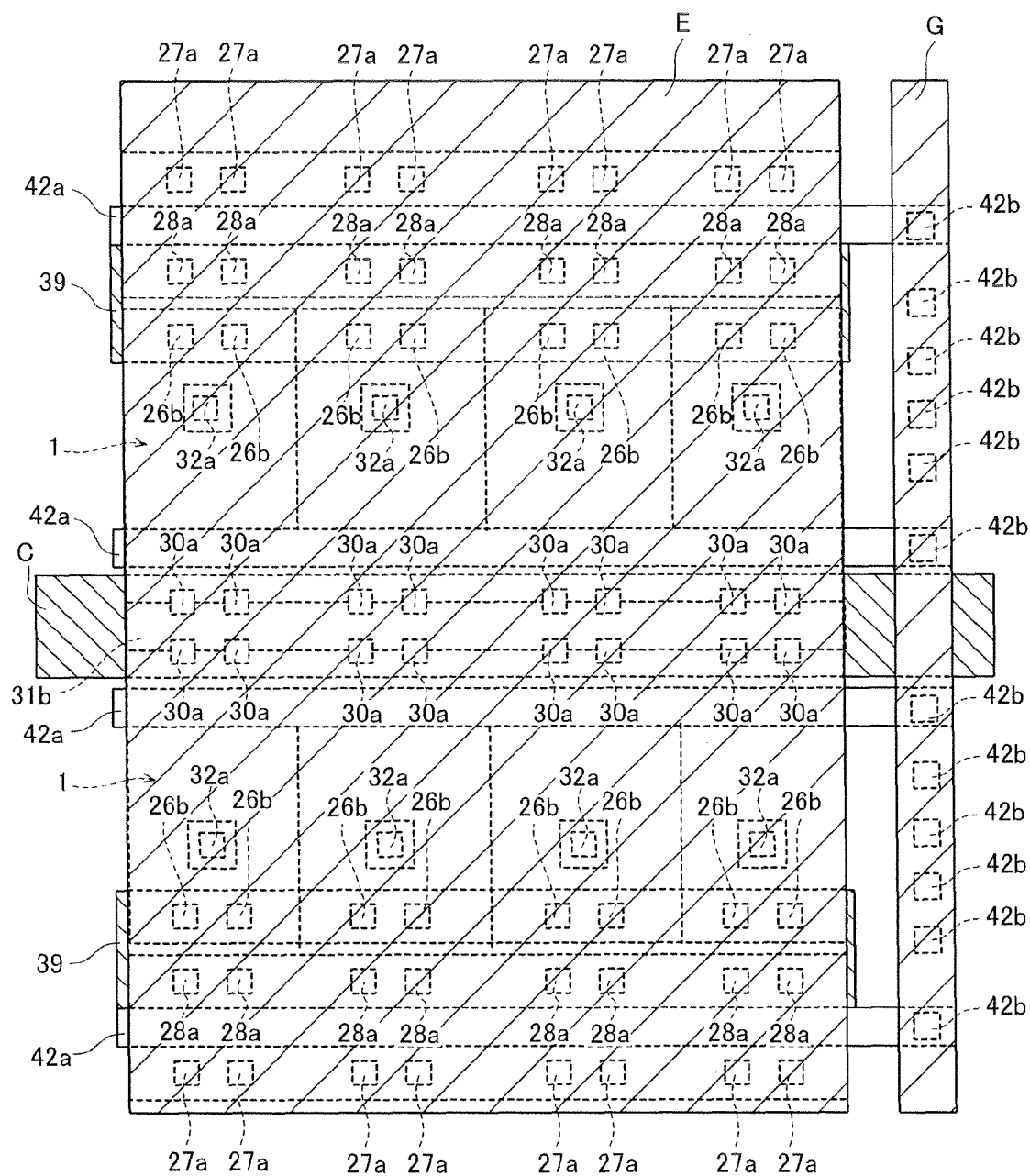
FIG. 4 is an electrode arrangement diagram when arranging the semiconductor devices according to the first embodiment shown in FIG. 1 in the form of an array.
Figure 5:
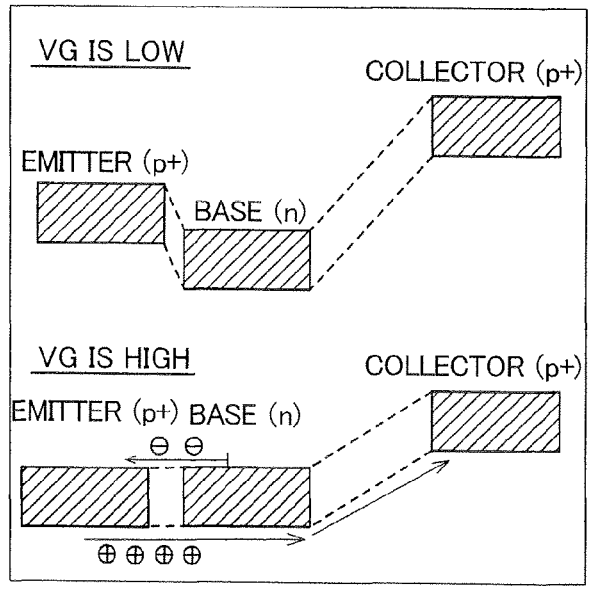
FIG. 5 is a model diagram of energy band of a pnp bipolar transistor according to the first embodiment of the present invention.
Figure 6:
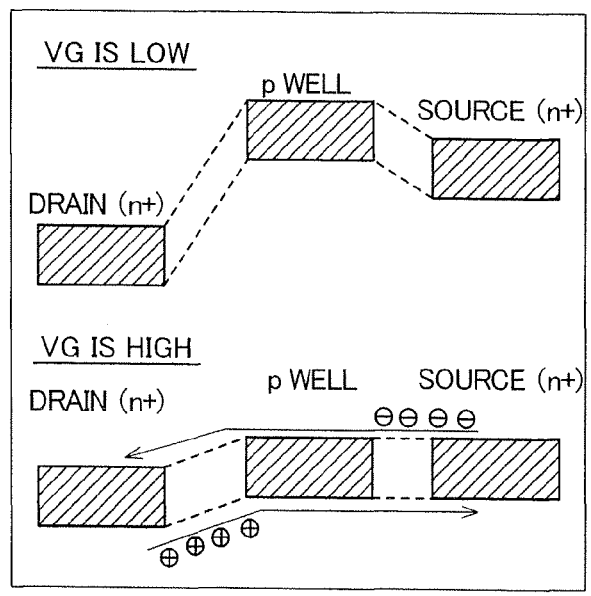
FIG. 6 is a model diagram of energy band of an NMOSFET according to the first embodiment of the present invention.

According to this embodiment, an intrinsic base layer 26a is formed under the p$^+$ emitter layer 32 on the surface of the n-type base layer 26 and has a thickness smaller than the depths of the n$^+$ drain region 29 and the n$^+$ source region 30 of the NMOSFET 11 and the depths of the p$^+$ source region 27 and the p$^+$ drain region 28 the PMOSFET 12. As shown in FIGS. 2 and 3, the p$^+$ source region 27 of the PMOSFET 12 and the p$^+$ emitter layer 32 of the bipolar transistor 13 are electrically connected to each other through the contact portions 27a and 32a (see FIG. 3). The n-type base layer 26 of the bipolar transistor 13 and the p$^+$ drain region 28 of the PMOSFET 12 are electrically connected to each other with a wiring 39 through contact portions 26b and 28a (see FIG. 3). The p$^+$ type gate electrode 35 and the n$^+$-type gate electrode 36 are formed with the same polysilicon gate 42. The n$^+$ source region 30 and the p$^+$ collector layer 31 are electrically connected to each other through the contact portions 30a and 31a (see FIG. 3). As shown in FIG. 3, the polysilicon gate 42 is arranged in the form of a U-shape in plan view, whereby devices of the NMOSFET 11, the pnp bipolar transistor 13 and the PMOSFET 12 can be arranged in alignment with each other in plan view. Thus, the area of a cell can be reduced. As shown in FIG. 4, when cells shown in FIG. 3 are arranged in the form of an array, the polysilicon gates 42a can be rendered common and the p$^+$ collector layer 31b of the pnp bipolar transistor 13 can be rendered common. Thus, the area per cell can be reduced. The polysilicon gates 42a are electrically connected to the gate terminal (G) wiring through contact portions 42b.

An operation of the semiconductor device 1 according to the first embodiment will be now described with reference to FIGS. 1, 2, 5 and 6.

In the semiconductor device according to the first embodiment 1, as shown in FIG. 1, when an input signal (VG) received in the gate terminal (G) of the inverter 14 is high, the NMOSFET 11 of the inverter 14 is turned on, and electrons are injected into the base (B) of the pnp bipolar transistor 13. Thus, the pnp bipolar transistor 13 is turned on, and a large quantity of holes flow in the collector (C) of the pnp bipolar transistor 13 (see a lower diagram in FIG. 5). On the other hand, when the input signal (VG) received in the gate terminal (G) of the inverter 14 is low, the PMOSFET 12 of the inverter 14 is turned on. Thus, the base (B) and the emitter (E) of the pnp bipolar transistor 13 are the same potential, and a reverse voltage is applied to p-n junctions between the base (B) and the collector (C) of the pnp bipolar transistor 13 (see an upper diagram in FIG. 5) and between the n$^+$ drain region 29 (drain) and the p well 23 of the NMOSFET 11 shown in FIG. 2 (see an upper diagram in FIG. 6), thereby preventing a current from flowing in the bipolar transistor 13.

According to the first embodiment, as hereinabove described, the semiconductor device 1 comprises the inverter 14 including the NMOSFET 11 and the PMOSFET 12 having the drain regions connected to each other and the pnp bipolar transistor 13 having the base (B) receiving the output of the inverter 14, whereby a current amplified with the bipolar transistor 13 can be extracted when the semiconductor device 1 is in an ON state, and hence an ON-state resistance can be reduced. Therefore, a larger current can be output in the collector (C) of the pnp bipolar transistor 13. When the input signal (VG) received in the gate terminal (G) is changed from a high level to a low level (turned off), the NMOSFET 11 and the PMOSFET 12 connected to each other can pull out holes stored in the pnp bipolar transistor 13, thereby allowing high speed turning off.

According to the first embodiment, the drain of the NMOSFET 11 and the drain of the PMOSFET 12 are connected to each other, and the base of the pnp bipolar transistor 13 receives the output of the inverter 14 (output of the drain of the NMOSFET 11 and the PMOSFET 12), whereby the potentials of the sources of the NMOSFET 11 and the PMOSFET 12 can be inhibited from being unstabilized due to the base of the pnp bipolar transistor 13. Thus, the potentials of the sources can be inhibited from being unstabilized, and hence a gate-to-source voltage ($V_{GS}$) can be inhibited from being unstabilized. Consequently, the threshold voltages of the NMOSFET 11 and the PMOSFET 12 are stabilized, whereby the operation of the semiconductor device 1 can be stabilized. Therefore, when the semiconductor device 1 is arranged as a switching device in a circuit, for example, an output from the collector (C) can be stably controlled.

When the semiconductor device 1 is in an OFF-state, the reverse voltage is applied to the p-n junctions between the n-type base layer 26 and the p$^+$ collector layer 31 of the pnp bipolar transistor 13 and between the n$^+$ drain region 29 and the p well 23 of the NMOSFET 11, and hence the semiconductor device 1 can be maintained at an OFF-state. The breakdown voltage is not maintained by the thickness of the n-type base layer 26 of the bipolar transistor 13 like an IGBT, and hence the thickness of the n-type base layer 26 can be reduced.

According to the first embodiment, the thickness of the intrinsic base layer 26a of the pnp bipolar transistor 13 is so formed as to be smaller than the depths of the sources and the drains of the NMOSFET 11 and the PMOSFET 12, whereby the thickness of the intrinsic base layer 26a is reduced and hence high speed switching can be achieved.

According to the first embodiment, the semiconductor device 1 further comprises the p-type silicon substrate 21 having the main surface on which the NMOSFET 11 and the PMOSFET 12 are formed, the n$^+$ drain region 29, the n$^+$ source region 30 and the n$^+$-type gate electrode 36 of the NMOSFET 11, the p$^+$ source region 27, the p$^+$ drain region 28 and the p$^+$ type gate electrode 35 of the PMOSFET 12 and the n-type base layer 26, the p$^+$ collector layer 31 and the p$^+$ emitter layer 32 of the pnp bipolar transistor 13 are formed on the main surface of the p-type silicon substrate 21, whereby all the terminals are formed on the main surface. Thus, other semiconductor devices (not shown) can be easily integrated on the main surface of the p-type silicon substrate 21.

According to the first embodiment, the NMOSFET 11 is formed between the n-type base layer 26 and the p$^+$ collector layer 31 of the bipolar transistor 13 on the main surface of the p-type silicon substrate 21, whereby the n-type base layer 26 of the pnp bipolar transistor 13 and the n$^+$ drain region 29 of the NMOSFET 11, and the p$^+$ collector layer 31 of the pnp bipolar transistor 13 and the n$^+$ source region 30 of the NMOSFET 11 are so formed as to be adjacent to each other respectively, and hence the n-type base layer 26 of the pnp bipolar transistor 13 and the n$^+$ drain region 29 of the NMOSFET 11, and the p$^+$ collector layer 31 of the pnp bipolar transistor 13 and the n$^+$ source region 30 of the NMOSFET 11 are easily electrically connected to each other respectively. Thus, the degree of integration can be improved when the semiconductor device 1 is arranged in the form of an array. The p$^+$ collector layer 31 of the pnp bipolar transistor 13 serves as a guard ring, and hence noise can be absorbed.

According to the first embodiment, the n$^+$ drain region 29 of the NMOSFET 11 and the n-type base layer 26 of the pnp bipolar transistor 13 are so formed as to be in direct contact with each other, whereby the n$^+$ drain region 29 of the NMOSFET 11 and the n-type base layer 26 of the pnp bipolar transistor 13 can be recognized as the same single n-type region. In other words, the n$^+$ drain region 29 of the NMOSFET 11 and the n-type base layer 26 of the pnp bipolar transistor 13 function as a single region, and hence the area of a p-n junction portion between the p well 23 and the n$^+$ drain region 29 and the n-type base layer 26 is increased, as compared with a case where an element isolation region is formed between the n$^+$ drain region 29 of the NMOSFET 11 and the n-type base layer 26 of the pnp bipolar transistor 13. Therefore, the high breakdown voltage of the semiconductor device 1 can be achieved.

Second Embodiment

Figure 7:
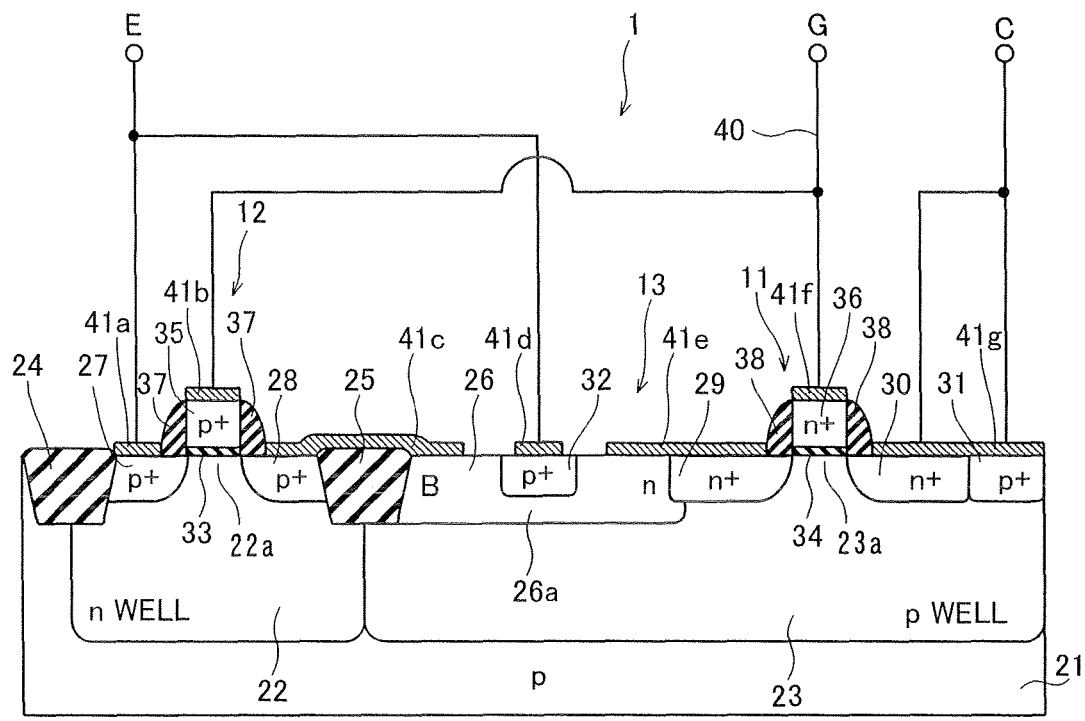
FIG. 7 is a sectional view of a semiconductor device according to a second embodiment of the present invention.

Referring to FIG. 7, in a semiconductor device according to a second embodiment, a surface of a semiconductor substrate and upper portions of gate electrodes are silicided dissimilarly to the aforementioned first embodiment.

In the semiconductor device according to the second embodiment, as shown in FIG. 7, surfaces of a p$^+$ source region 27, a p$^+$-type gate electrode 35, a p$^+$ drain region 28, an n-type base layer 26, a p$^+$ emitter layer 32, an n$^+$ drain region 29, an n$^+$-type gate electrode 36, an n$^+$ source region 30 and a p$^+$ collector layer 31 are silicided, and metal silicide films 41a to 41g are formed. Thus, surfaces of respective impurity regions of the n-type base layer 26, the p$^+$ source region 27, the p$^+$ drain region 28, the n+drain region 29, the n$^+$ source region 30, the p$^+$ collector layer 31 and the p$^+$ emitter layer 32, and upper portions of the p+-type gate electrode 35 and the n+-type gate electrode 36 are silicided, whereby the resistances of the respective impurity regions and the resistances of the p+-type gate electrode 35 and the n+-type gate electrode 36 can be reduced. The n-type base layer 26 and the n+ drain region 29 are electrically connected to each other with the metal silicide film 41e. Polysilicon (not shown) is arranged on the surface of the element isolation oxide film 25 to be silicided, whereby the metal silicide film 41c can be formed on the element isolation oxide film 25. Thus, the p+ drain region 28 as a drain of a PMOSFET 12 and the n-type base layer 26 of a pnp bipolar transistor 13 can be easily electrically connected to each other. Consequently, layout of a wiring layer of the device can be easily carried out. The n+ source region 30 and the p+ collector layer 31 are electrically connected to each other with the metal silicide film 41g.

The remaining effects of the second embodiment are similar to those of the aforementioned first embodiment.

A process of fabricating the semiconductor device according to the second embodiment will be now described with reference to FIGS. 8 to 15.

Figure 8:
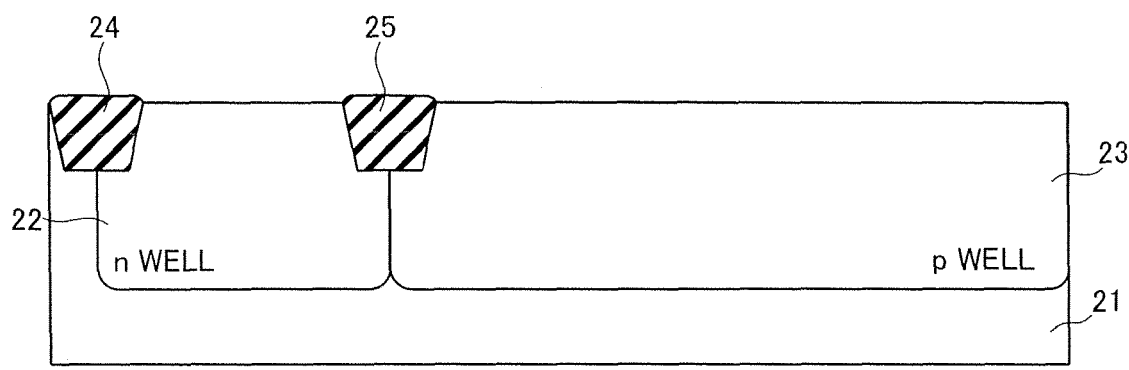
FIGS. 8 to 15 are sectional views for illustrating a process of fabricating the semiconductor device according to the second embodiment of the present invention.

As shown in FIG. 8, element isolation oxide films 24 and 25 by shallow trench isolation (STI) are formed on prescribed regions of a surface of a p-type silicon substrate 21, for example. Thereafter phosphorus is implanted into a prescribed region on the p-type silicon substrate 21, thereby forming an n well 22. Boron is implanted into a prescribed region on the p-type silicon substrate 21, thereby forming a p well 23. At this time, as implantation for preventing punch through of a channel region, arsenic is implanted into an n well 22 region, and boron is implanted into a p well 23 region. Thus, punch through of channels of the NMOSFET 11 and the PMOSFET 12 can be prevented and a threshold voltage can be controlled. An impurity layer in the p well 23 where boron is implanted in order to prevent punch through serves as a sub-collector.

Figure 9:
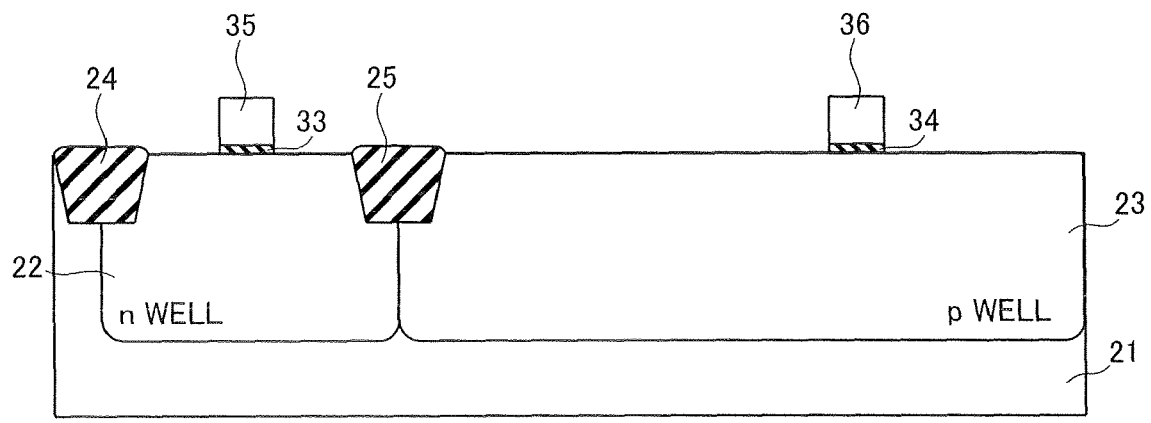

As shown in FIG. 9, gate oxide films 33 and 34 consisting of silicon oxide films are formed on surfaces of element forming regions by thermal oxidation, and the p+-type gate electrode 35 and the n+-type gate electrode 36 consisting of polysilicon are formed through the gate oxide films 33 and 34. Polysilicon may be amorphous silicon.

Figure 10:
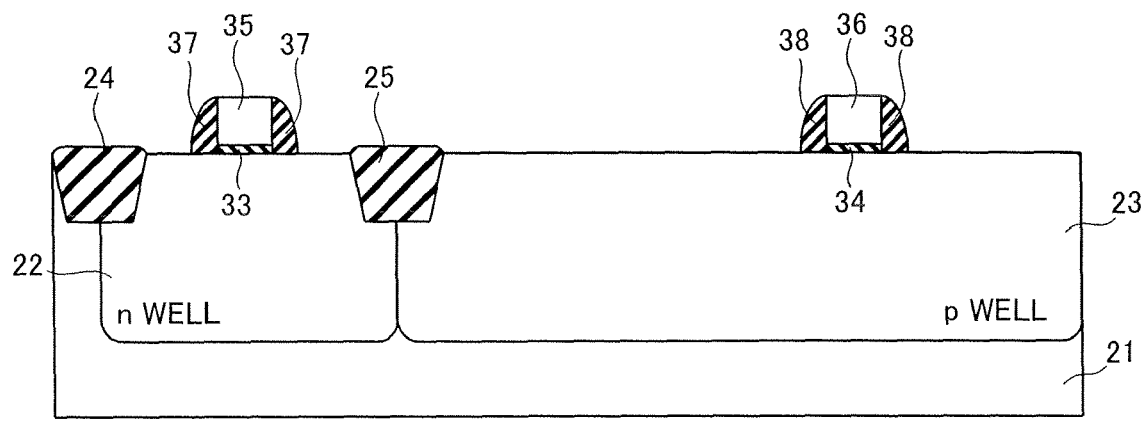

As shown in FIG. 10, for example, an insulating film such as HTO (high temperature oxide) is formed and thereafter side wall spacers 37 and 38 are formed by etching employing anisotropic etching.

Figure 11:
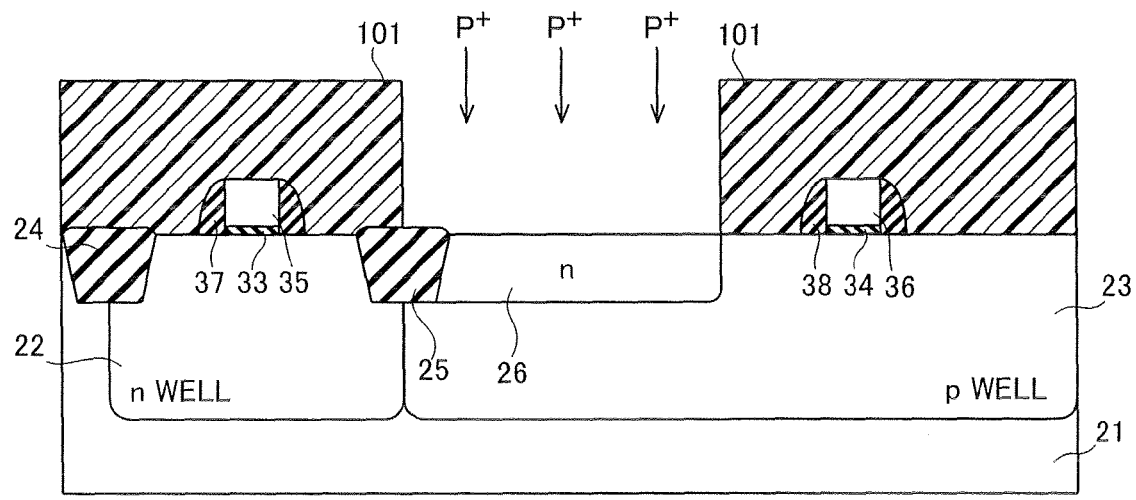

As shown in FIG. 11, a photoresist 101 is so formed as to cover regions other than a region formed with the n-type base layer 26 and thereafter the photoresist 101 is employed as a mask for implanting phosphorus, for example. Thus, the n-type base layer 26 of the pnp bipolar transistor 13 is formed. Thereafter the photoresist 101 is removed.

Figure 12:
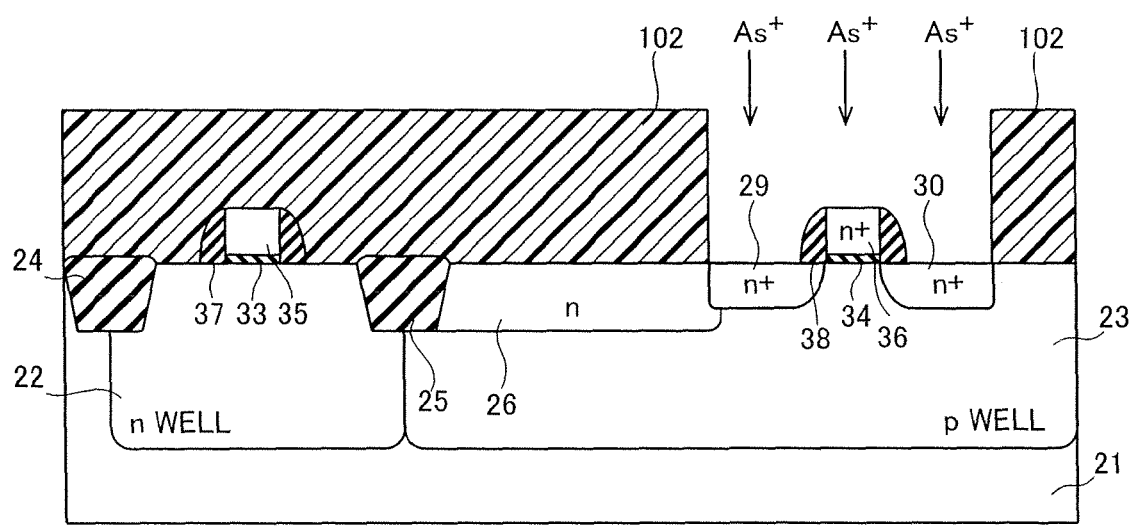

As shown in FIG. 12, a photoresist 102 is so formed as to cover regions other than a region formed with the NMOSFET 11 and thereafter the photoresist 102 is employed as a mask for implanting arsenic, for example. Implantation of the impurity into the n+-type gate electrode 36 of the NMOSFET 11 and formation of the n+ drain region 29 and the n+ source region 30 are simultaneously carried out. The n+ drain region 29 is so formed as to be continuous to the n-type base layer 26. Thereafter the photoresist 102 is removed.

Figure 13:
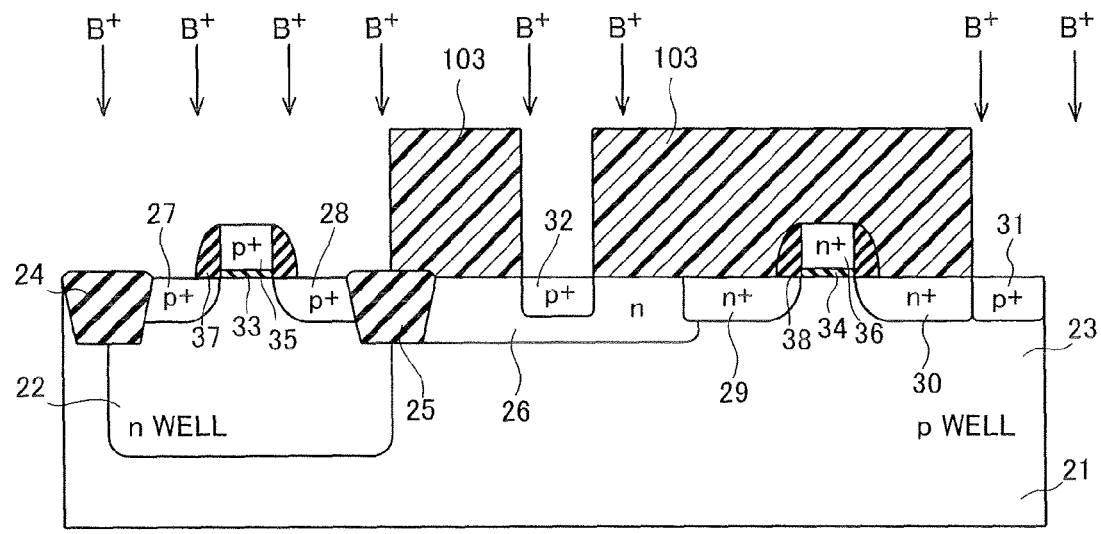

As shown in FIG. 13, a photoresist 103 is so formed as to cover regions other than regions formed with the PMOSFET 12, the p+ collector layer 31 and the p+ emitter layer 32 and thereafter boron is implanted, for example. Thus, implantation of the impurity into the p+-type gate electrode 35 of the PMOSFET 12 and formation of the p+ source region 27 and the p+ drain region 28 of the PMOSFET, and formation of the p+ emitter layer 32 and the p+ collector layer 31 of the pnp bipolar transistor are simultaneously carried out. Thereafter the photoresist 103 is removed.

Figure 14:
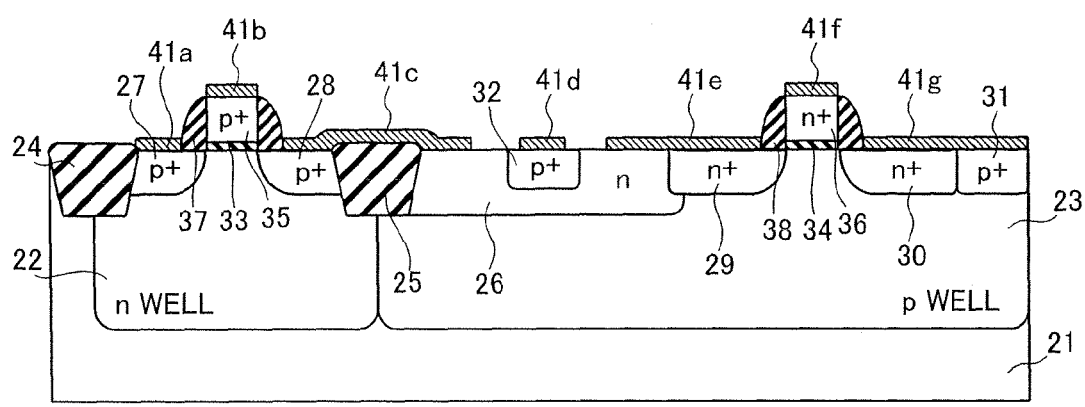

As shown in FIG. 14, the metal silicide films 41a to 41g are formed on the surfaces of the p+ source region 27, the p+-type gate electrode 35, the p+ drain region 28, the n-type base layer 26 and the p+ emitter layer 32 of the pnp bipolar transistor, the n+ drain region 29, the n+-type gate electrode 36, the n+ source region 30 and the p+ collector layer 31 of the pnp bipolar transistor, for example. For example, polysilicon (not shown) is partially formed on the element isolation oxide film 25 between the p+ drain region 28 and the n-type base layer 26 and thereafter the metal silicide film 41c is formed, thereby electrically connecting the p+ drain region 28 and the n-type base layer 26 to each other.

Figure 15:
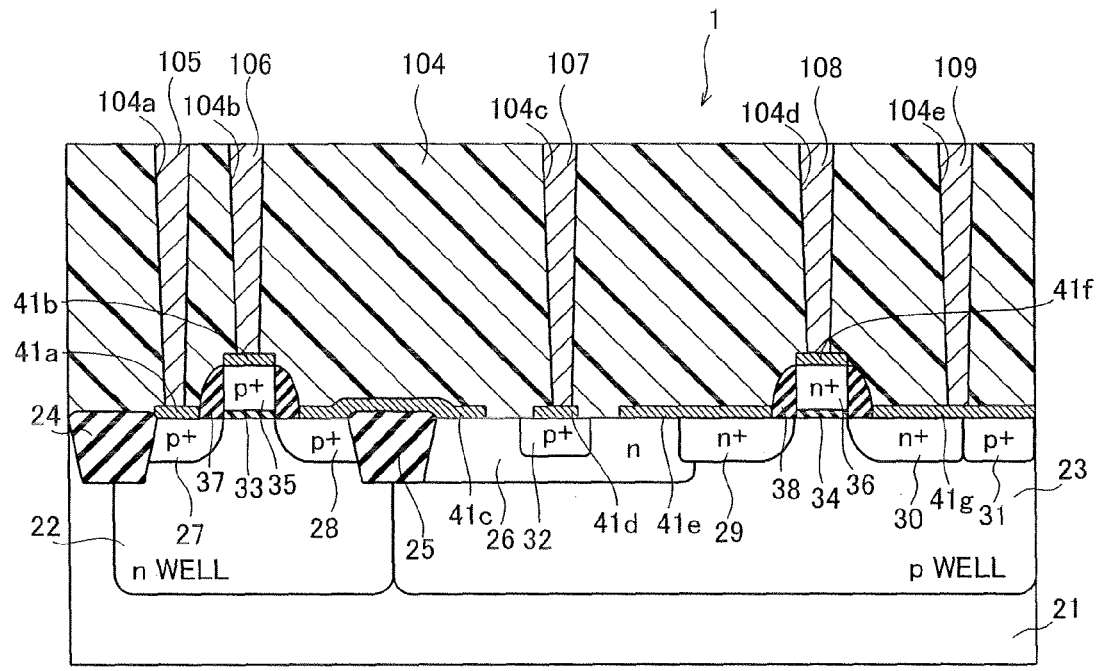

Finally, as shown in FIG. 15, interlayer dielectric films 104 consisting of oxide silicon are formed on an entire surface of the semiconductor device 1 by plasma CVD, and thereafter contact holes 104a, 104b, 104c, 104d and 104e reaching metal silicide films 41a, 41b, 41d, 41f and 41g respectively are formed in the interlayer dielectric films 104. Contact plugs 105, 106, 107, 108 and 109 are formed in the contact holes 104a, 104b, 104c, 104d and 104e respectively. Thus, the semiconductor device 1 according to the second embodiment is formed.

Third Embodiment

Figure 16:
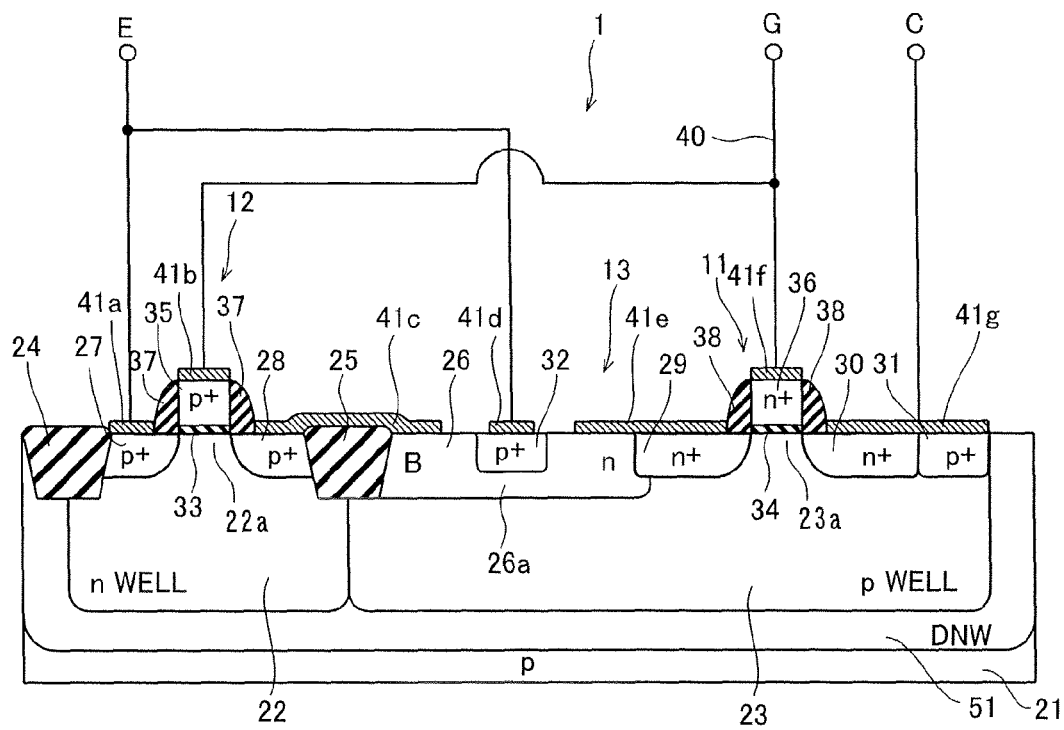
FIG. 16 is a sectional view of a semiconductor device according to a third embodiment of the present invention.

Referring to FIG. 16, according to a third embodiment, an n well 22 and a p well 23 are formed in a deep n well 51 (DNW) dissimilarly to the aforementioned second embodiment. Thus, a current diffusing to the p-type silicon substrate 21 among a collector current of a pnp bipolar transistor 13 can be suppressed, whereby a current can be effectively converged in the p+ collector layer 31. Consequently, the ON-state resistance of the pnp bipolar transistor 13 can be reduced. The deep n well 51 is an example of the "second well region" in the present invention.

The remaining effects of the third embodiment are similar to those of the aforementioned second embodiment.

Fourth Embodiment

Figure 17:
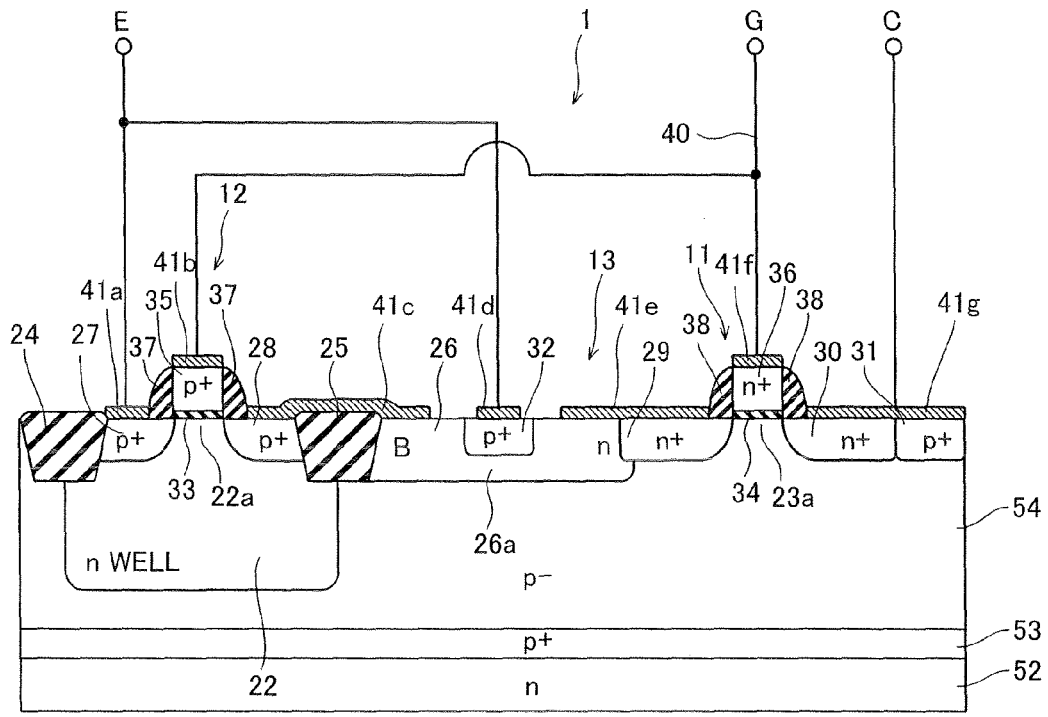
FIG. 17 is a sectional view of a semiconductor device according to a fourth embodiment of the present invention.

Referring to FIG. 17, according to a fourth embodiment, a p+ buried layer 53 is formed on a surface of an n-type silicon substrate 52 and a p− epitaxial layer 54 is formed dissimilarly to the aforementioned second embodiment. Thus, holes flow from an emitter (E) to a collector (C) through the low resistivity p+ buried layer 53, and hence the collector resistance of a pnp bipolar transistor 13 can be reduced. Consequently, a turning-on time of switching can be reduced. The p+ buried layer 53 and the p− epitaxial layer 54 are examples of the "first buried layer" and the "first semiconductor region" in the present invention.

The remaining effects of the fourth embodiment are similar to those of the aforementioned second embodiment.

Fifth Embodiment

Figure 18:
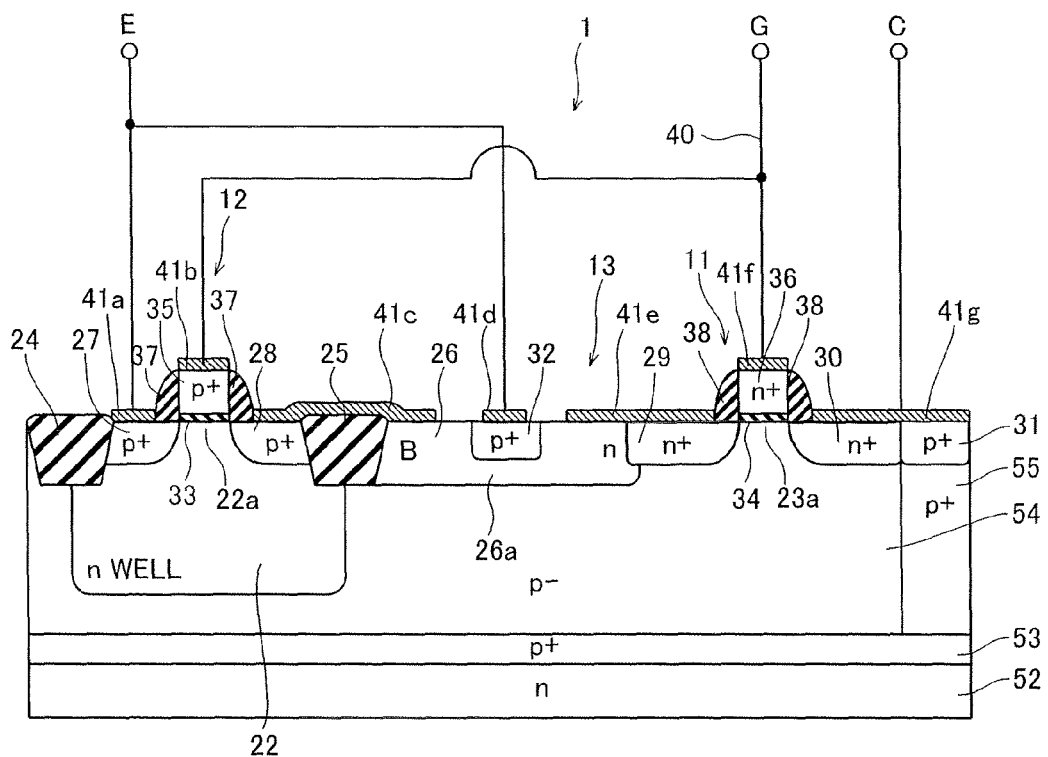
FIG. 18 is a sectional view of a semiconductor device according to a fifth embodiment of the present invention.

Referring to FIG. 18, a semiconductor device 1 according to a fifth embodiment has a p+-type reach through 55 reaching from a p+ collector layer 31 employed as a high concentration impurity layer to a p+ buried layer 53 dissimilarly to the aforementioned semiconductor device according to the fourth embodiment. Thus, holes flow from an emitter (E) to a collector (C) through a low resistivity p+ buried layer 53, the low resistivity p$^+$-type reach through 55, the low resistivity p$^+$ collector layer 31, and hence the collector resistance of the pnp bipolar transistor 13 can be further reduced. The p$^+$-type reach through 55 is an example of the "second semiconductor region" in the present invention.

The remaining effects of the fifth embodiment are similar to those of the aforementioned second embodiment.

Sixth Embodiment

Figure 19:
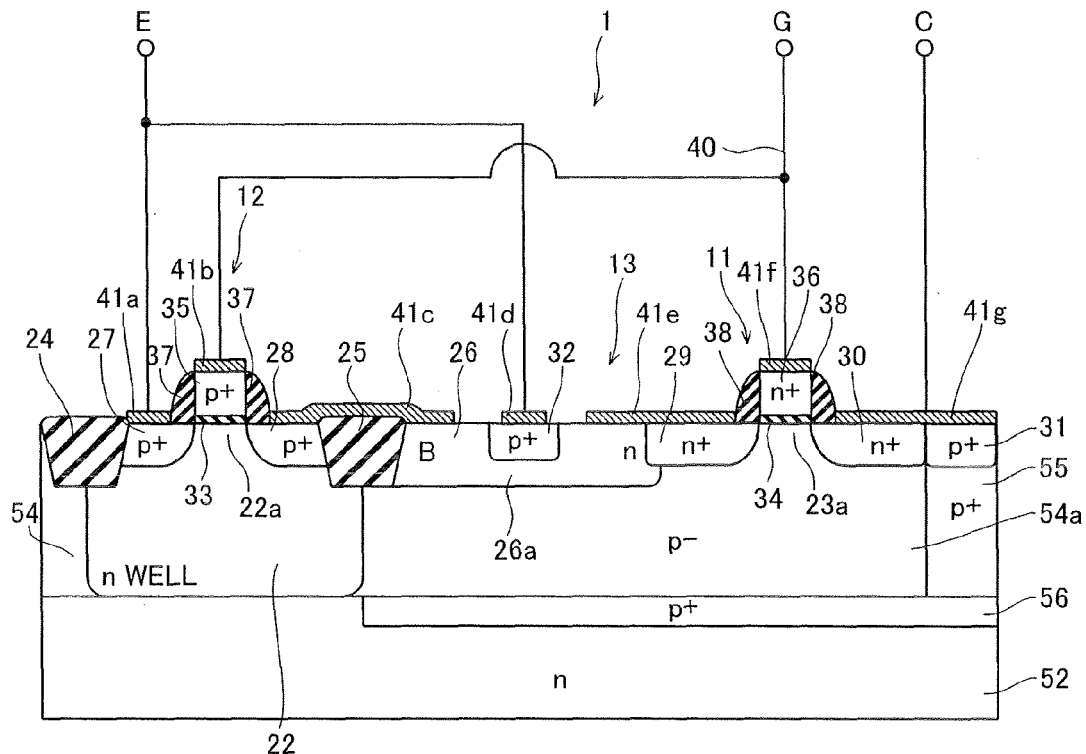
FIG. 19 is a sectional view of a semiconductor device according to a sixth embodiment of the present invention.

Referring to FIG. 19, according to a sixth embodiment, a p$^+$ buried layer 56 is formed only in a prescribed region of the n-type silicon substrate 52 dissimilarly to the aforementioned fifth embodiment. Thus, the parasitic capacitance between the p$^+$ buried layer 56 and the n-type silicon substrate 52, and the parasitic capacitance between an n well 22 and a p$^-$ epitaxial layer 54a can be reduced, and hence a switching time can be reduced. The depth from a surface of the p$^+$ buried layer 56 can be designed regardless of the n well 22, and hence the pnp bipolar transistor 13 can be easily optimized, and a switching time can be further reduced.

The remaining effects of the sixth embodiment are similar to those of the aforementioned second embodiment.

Seventh Embodiment

Figure 20:
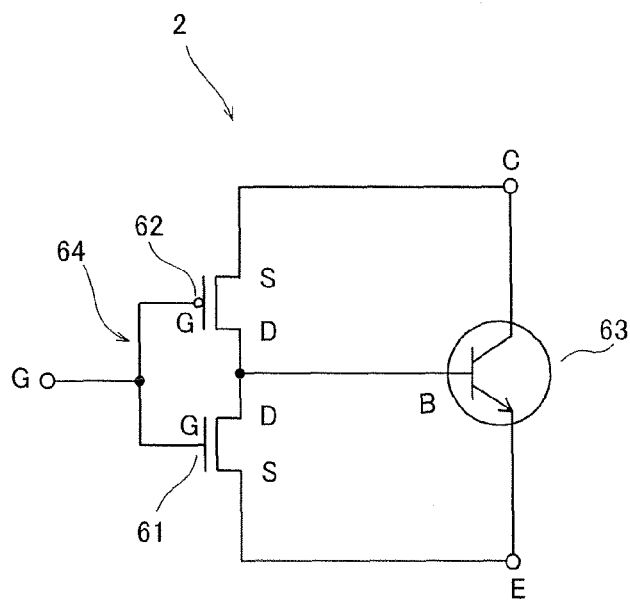
FIG. 20 is a circuit diagram of a semiconductor device according to a seventh embodiment of the present invention.
Figure 21:
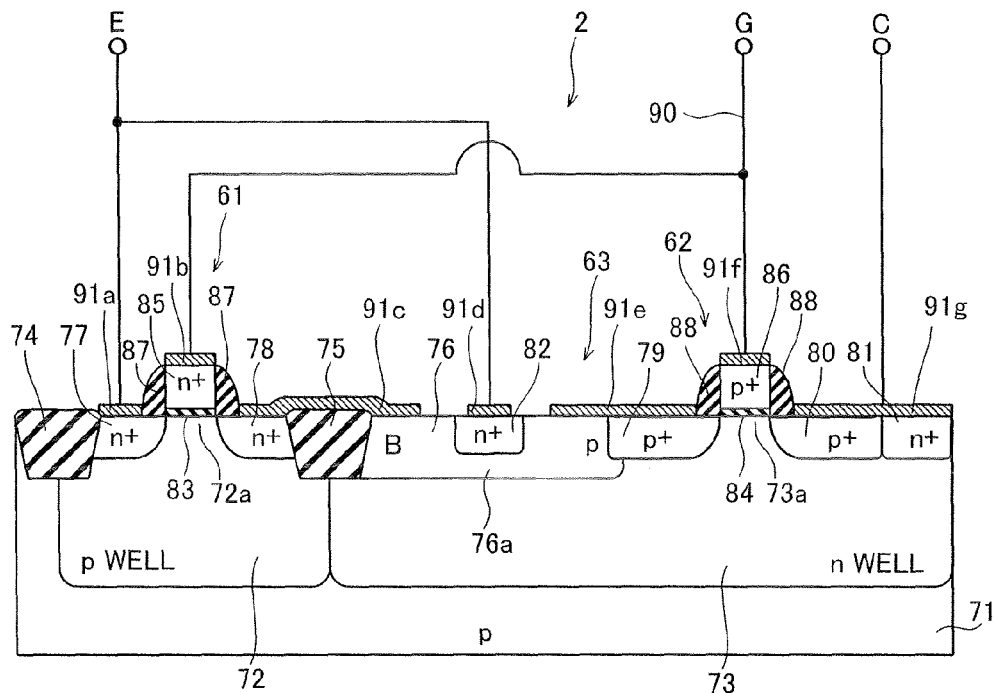
FIG. 21 is a sectional view of the semiconductor device according to the seventh embodiment of the present invention.

Referring to FIGS. 20 and 21, according to a seventh embodiment, an npn bipolar transistor 63 substitutes for a bipolar transistor 63 receiving an output of an inverter 64 dissimilarly to the aforementioned second embodiment. A structure of a semiconductor device according to the seventh embodiment of the present invention will be now described with reference to FIGS. 20 and 21.

A semiconductor device 2 according to the seventh embodiment is constituted by an NMOSFET 61, a PMOSFET 62 and the npn bipolar transistor 63 as shown in FIG. 21. The NMOSFET 61 is an example of the "second conductive type second field-effect transistor" in the present invention, and the PMOSFET 62 is an example of the "first conductive type first field-effect transistor" in the present invention. A source of the NMOSFET 61 and an emitter (E) of the npn bipolar transistor 63 are electrically connected to each other. A source of the PMOSFET 62 and a collector (C) of the npn bipolar transistor 63 are electrically connected to each other. A drain of the NMOSFET 61 and a drain of the PMOSFET 62 are connected to a base (B) of the npn bipolar transistor 63. A gate of the NMOSFET 61 and a gate of the PMOSFET 62 are connected to a gate terminal (G). The drain of the NMOSFET 61 and the drain of the PMOSFET 62 are connected to each other and the NMOSFET 61 and the PMOSFET 62 form the inverter 64. The base (B) of the npn bipolar transistor 63 receives an output of this inverter 64. An output of the semiconductor device 2 is carried out from the source of the PMOSFET 62 and the collector (C) of the npn bipolar transistor 63.

As shown in FIG. 21, a p well 72, an n well 73 and element isolation oxide films 74 and 75 are formed on a main surface of the p-type silicon substrate 71. An n$^+$ source region 77 and an n$^+$ drain region 78 are so formed on a surface of the p well 72 at a prescribed interval as to hold a channel region 72a therebetween. The n$^+$ source region 77 and the n$^+$ drain region 78 function as the source and the drain of the NMOSFET 61 respectively. The n$^+$ source region 77 and the n$^+$ drain region 78 may be so formed as to have a LDD (lightly doped drain) structure. An n$^+$-type gate electrode 85 consisting of polysilicon doped with an n-type impurity is formed on the channel region 72a through a gate oxide film 83. The n$^+$ source region 77, the n$^+$ drain region 78, the channel region 72a and the n$^+$ type gate electrode 85 constitute the NMOSFET 61. A side wall spacer 87 consisting of HTO (high temperature oxide) and the like is formed on side surfaces of the n$^+$ type gate electrode 85.

A p$^+$ drain region 79 and a p$^+$ source region 80 are so formed on a surface of the n well 73 at a prescribed interval as to hold a channel region 73a therebetween. The p$^+$ drain region 79 and the p$^+$ source region 80 function as the drain and the source of the PMOSFET 62. The p$^+$ drain region 79 and the p$^+$ source region 80 are so formed as to have a LDD (lightly doped drain) structure. A p$^+$-type gate electrode 86 consisting of polysilicon doped with a p-type impurity is formed on the channel region 73a through a gate oxide film 84. The p$^+$ drain region 79, the p$^+$ source region 80, the channel region 73a, the p$^+$-type gate electrode 86 constitute the PMOSFET 62. A side wall spacer 88 consisting of HTO (high temperature oxide) is formed on side surfaces of the p$^+$ type gate electrode 86.

A p-type base layer 76 of the npn bipolar transistor 63 and an n$^+$ collector layer 81 of the npn bipolar transistor 63 are so formed on the surface of the n well 73 at a prescribed interval as to hold the p$^+$ drain region 79 and the p$^+$ source region 80 of the PMOSFET 62. The p-type base layer 76 is so formed as to be continuous to the p$^+$ drain region 79 of the PMOSFET 62 and the n$^+$ collector layer 81 is so formed as to be adjacent to the p$^+$ source region 80 of the PMOSFET 62. An n$^+$ emitter layer 82 of the npn bipolar transistor 63 is formed on a surface of the p-type base layer 76. Thus, according to this embodiment, all terminals of the n$^+$ source region 77, the n$^+$ drain region 78 and the n$^+$-type gate electrode 85 of the NMOSFET 61, the p$^+$ drain region 79, the p$^+$ source region 80 and the p$^+$ type gate electrode 86 of the PMOSFET 62, and the p-type base layer 76, the n$^+$ collector layer 81 and the n$^+$ emitter layer 82 of the npn bipolar transistor 63 are formed on the main surface of the p-type silicon substrate 71. The n$^+$ collector layer 81 is an example of the "second collector extraction region" in the present invention.

According to the seventh embodiment, an intrinsic base layer 76a is formed under the n$^+$ emitter layer 82 on the surface of the p-type base layer 76 and has a thickness smaller than the depths of the n$^+$ source region 77 and the n$^+$ drain region 78 of the NMOSFET 61 and the depths of the p$^+$ drain region 79 and the p$^+$ source region 80 of the PMOSFET 62.

Prescribed surfaces of the n$^+$ source region 77, the n$^+$-type gate electrode 85, the n$^+$ drain region 78, the p-type base layer 76, the n$^+$ emitter layer 82, the p$^+$ drain region 79, the p$^+$-type gate electrode 86, the p$^+$ source region 80 and the n$^+$ collector layer 81 are silicided, and metal silicide films 91a to 91g are formed. Thus, surfaces of respective impurity regions of the p-type base layer 76, the n$^+$ source region 77, the n$^+$ drain region 78, the p$^+$ drain region 79, the p$^+$ source region 80 and the n$^+$ emitter layer 82, and upper portions of the n$^+$-type gate electrode 85 and the p$^+$-type gate electrode 86 are silicided, whereby the resistances of the respective impurity region and the resistances of the n$^+$-type gate electrode 85 and the p$^+$-type gate electrode 86 can be reduced. The p-type base layer 76 and the p$^+$ drain region 79 are electrically connected to each other with the metal silicide film 91e. Polysilicon (not shown) is arranged on the surface of the element isolation oxide film 75 to be silicided, whereby a portion on the element isolation oxide film 75 of the metal silicide film 91c can be formed. Thus, the n$^+$ drain region 78 as a drain of an NMOSFET 61 and the p-type base layer 76 of the npn bipolar transistor 63 can be easily electrically connected to each other. Consequently, layout of a wiring layer of the device can be easily carried out. The p+ source region 80 and the n+ collector layer 81 are electrically connected to each other with the metal silicide film 91g.

An operation of the semiconductor device according to the seventh embodiment will be now described with reference to FIGS. 20 and 21. When an input signal (VG) received in the gate terminal (G) of the inverter 64 is low, the PMOSFET 62 of the inverter 64 is turned on, and holes are injected into the base (B) of the npn bipolar transistor 63. Thus, the npn bipolar transistor 63 is turned on, and a large quantity of electrons flow in the collector (C). On the other hand, when the input signal (VG) received in the gate terminal (G) of the inverter 64 is high, the NMOSFET 61 of the inverter 64 is turned on. Thus, the base (B) and the emitter (E) of the npn bipolar transistor 63 are the same potential, and a breakdown voltage is maintained by p-n junctions between the base (B) and the collector (C) of the npn bipolar transistor 63 and between the p+ drain region 79 and the n well 73 of the PMOSFET 62 shown in FIG. 21.

According to the seventh embodiment, as hereinabove described, the semiconductor 2 comprises the inverter 64 including the NMOSFET 61 and the PMOSFET 62 having the drain regions connected to each other and the npn bipolar transistor 63 having the base (B) receiving the output of the inverter 64, whereby a current amplified with the bipolar transistor 63 can be extracted when the semiconductor device 2 is in an ON state and hence an ON-state resistance can be reduced. When the input signal (VG) is changed from a low level to a high level (turned off), the NMOSFET 61 and the PMOSFET 62 connected to each other can pull out electrons stored in the npn bipolar transistor 63, thereby allowing high speed turning off. For example, the source of the NMOSFET 61 and the source of the PMOSFET 62 are so formed as to be connected to a power supply line, whereby the voltages of the sources of the NMOSFET 61 and the PMOSFET 62 are stabilized, and hence a gate-to-source potential ($V_{GS}$) can be stabilized. Consequently, the threshold voltages of the NMOSFET 61 and the PMOSFET 62 are stabilized, and hence the operation of the semiconductor device can be stabilized. The bipolar transistor 63 is substituted by the npn bipolar transistor, whereby mobility can be enhanced, and hence a turning-on time can be reduced and an ON-state resistance can be reduced. When the semiconductor device 2 is in an OFF-state, the breakdown voltage is maintained by the p-n junctions between the p type base layer 76 and the n+ collector layer 81 of the npn bipolar transistor 63 and between the p+ drain region 79 and the n well 73 of the PMOSFET 62 and the breakdown voltage is not maintained by the thickness of the p-type base layer 76 of the npn bipolar transistor 63 like an IGBT, and hence the thickness of the p-type base layer 76 can be reduced.

According to the seventh embodiment, the thickness of the intrinsic base layer 76a of the npn bipolar transistor 63 is so formed as to be smaller than the depths of the sources and the drains of the NMOSFET 61 and the PMOSFET 62, whereby the thickness of the intrinsic base layer 76a is reduced and hence high speed switching can be achieved.

According to the seventh embodiment, the semiconductor device 2 further comprises the p-type silicon substrate 71 having the main surface on which the NMOSFET 61 and the PMOSFET 62 are formed, the n+ source region 77, the n+ drain region 78 and the n+-type gate electrode 85 of the NMOSFET 61, the p+ drain region 79, the p+ source region 80 and the p+ type gate electrode 86 of the PMOSFET 62, and the p-type base layer 76, the n+ collector layer 81 and the n+ emitter layer 82 of the npn bipolar transistor 63 are formed on the main surface of the p-type silicon substrate 71, whereby all the terminals are formed on the main surface. Thus, other semiconductor devices can be easily integrated on the main surface of the p-type silicon substrate 71.

According to the seventh embodiment, the PMOSFET 62 is formed between the p-type base layer 76 and the n+ collector layer 81 of the npn bipolar transistor 63 on the main surface of the p-type silicon substrate 71, whereby the p-type base layer 76 of the npn bipolar transistor 63 and the p+ drain region 79 of the PMOSFET 62, and the n+ collector layer 81 of the npn bipolar transistor 63 and the p+ source region 80 of the PMOSFET 62 are so formed as to be adjacent to each other respectively, and hence the p-type base layer 76 of the npn bipolar transistor 63 and the p+ drain region 79 of the PMOSFET 62, and the n+ collector layer 81 of the npn bipolar transistor 63 and the p+ source region 80 of the PMOSFET 62 can be easily electrically connected to each other respectively.

Eighth Embodiment

Figure 22:
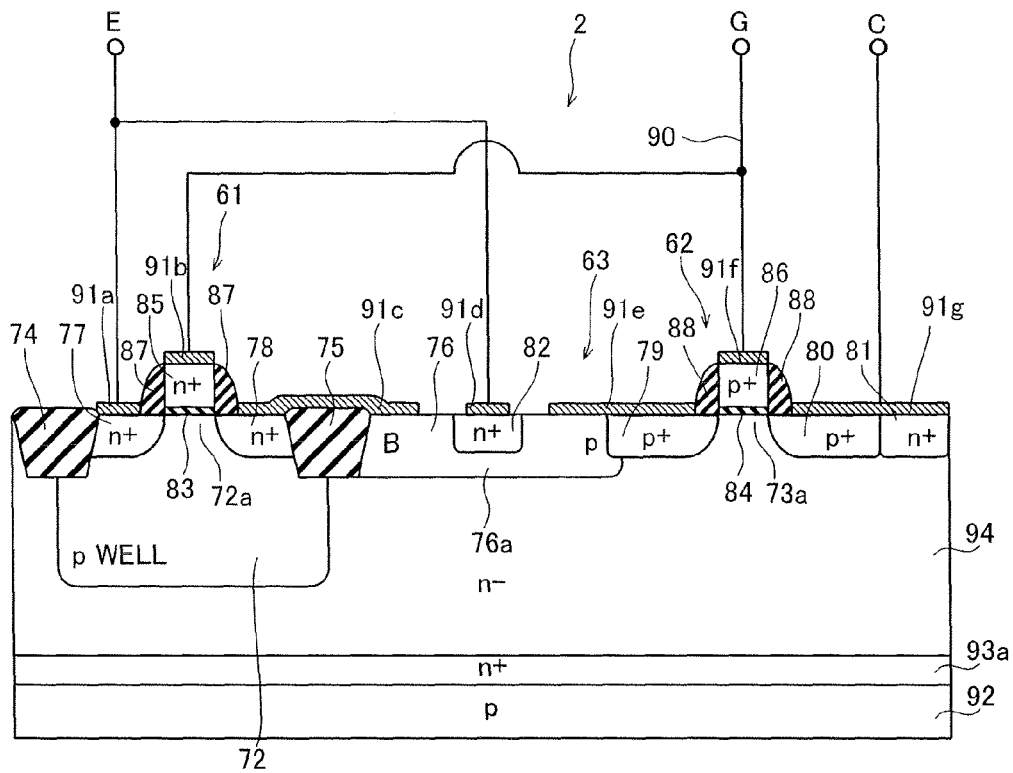
FIG. 22 is a sectional view of a semiconductor device according to an eighth embodiment of the present invention.

Referring to FIG. 22, according to an eighth embodiment, a low resistivity n+ buried layer 93a is formed on a surface of a p-type silicon substrate 92 and an n− epitaxial layer 94 is further formed dissimilarly to the aforementioned seventh embodiment. Thus, electrons flow from an emitter (E) to a collector (C) through a low resistivity n+ buried layer 93a, and hence a collector resistance of an npn bipolar transistor 63 can be reduced and a turning-on time of switching can be reduced.

The remaining effects of the eighth embodiment are similar to those of the aforementioned seventh embodiment.

Ninth Embodiment

Figure 23:
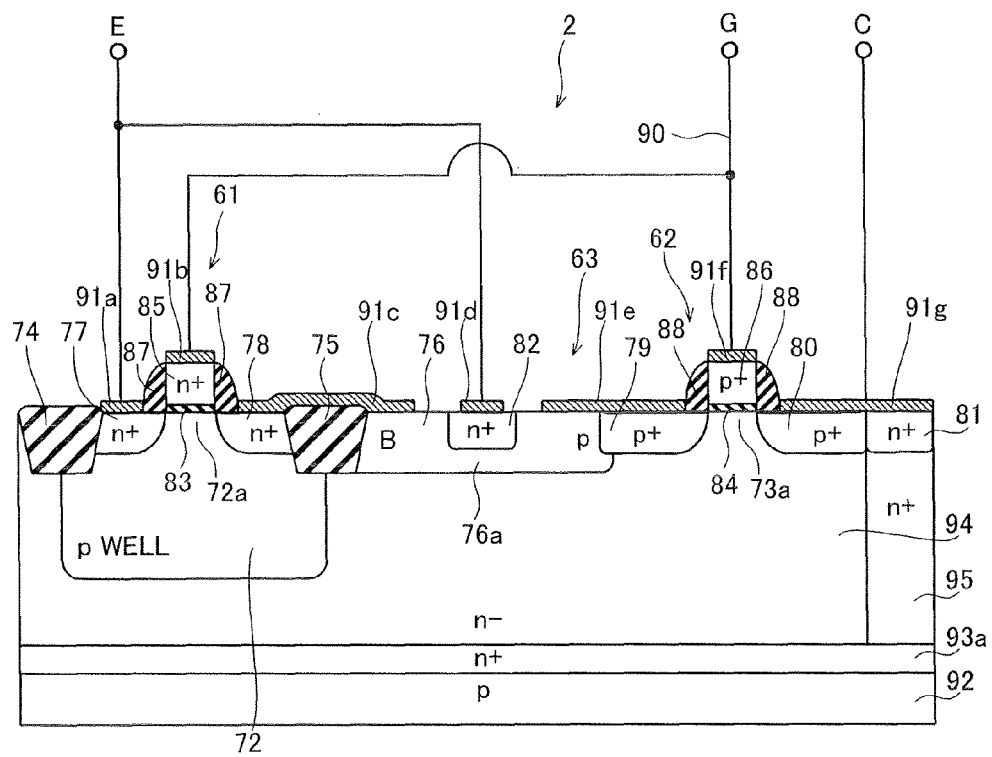
FIG. 23 is a sectional view of a semiconductor device according to a ninth embodiment of the present invention.

Referring to FIG. 23, a semiconductor device according to a ninth embodiment has an n+-type reach through 95 reaching from an n+ collector layer 81 employed as a high concentration impurity layer to an n+ buried layer 93a dissimilarly to the aforementioned semiconductor device according to the eighth embodiment. Thus, electrons flow from an emitter (E) to a collector (C) through a low resistivity n+ buried layer 93a, the low resistivity n+-type reach through 95, the low resistivity n+ collector layer 81, and hence the collector resistance of the npn bipolar transistor 63 can be further reduced. The n+-type reach through 95 is an example of the "fourth semiconductor region" in the present invention.

The n+ buried layer 93a is an example of the "second buried layer" in the present invention.

The remaining effects of the ninth embodiment are similar to those of the aforementioned seventh embodiment.

Tenth Embodiment

Figure 24:
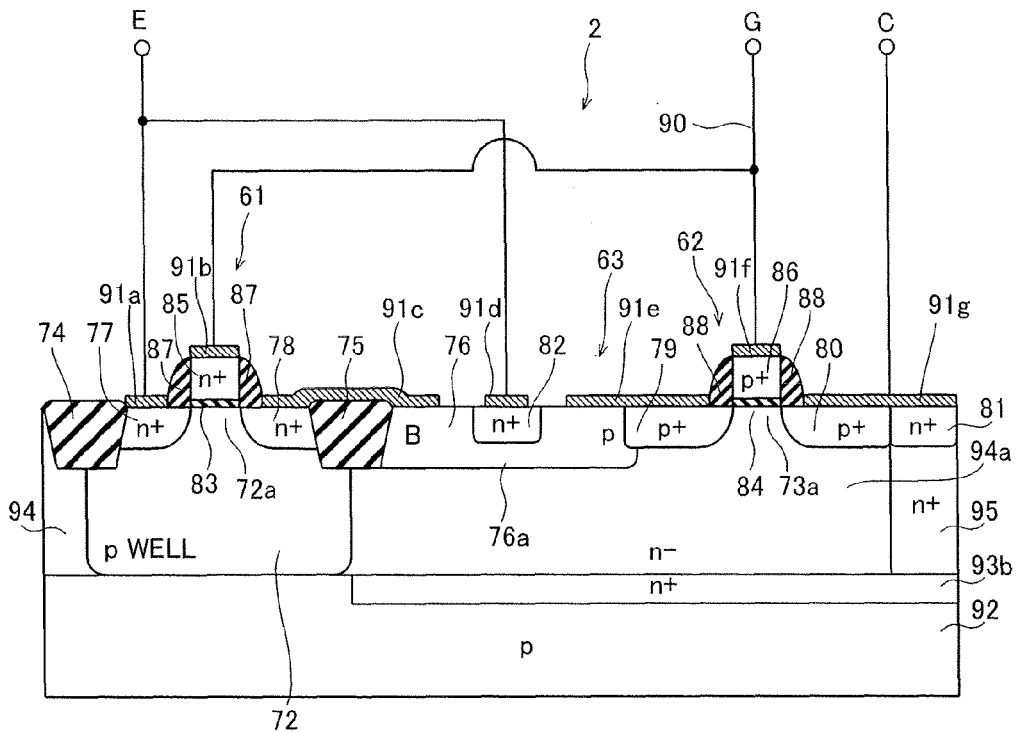
FIG. 24 is a sectional view of a semiconductor device according to a tenth embodiment of the present invention.

Referring to FIG. 24, according to a tenth embodiment, an n+ buried layer 93b is formed only in a prescribed region of the p-type silicon substrate 92 dissimilarly to the aforementioned ninth embodiment. Thus, the parasitic capacitance between the n+ buried layer 93b and the p-type silicon substrate 92, and the parasitic capacitance between a p well 72 and an n− epitaxial layer 94a can be reduced, and hence a turning-on time of switching can be reduced. The depth from a surface of the n+ buried layer 93b can be designed regardless of the p well 72, and hence the npn bipolar transistor 63 can be easily optimized, and a switching time can be further reduced. The n− epitaxial layer 94a is an example of the "third semiconductor region" in the present invention.

The remaining effects of the tenth embodiment are similar to those of the aforementioned seventh embodiment.

Although the present invention has been described and illustrated in detail, it is clearly understood that the same is by way of illustration and example only and is not to be taken by way of limitation, the spirit and scope of the present invention being limited only by the terms of the appended claims.

Figure 25:
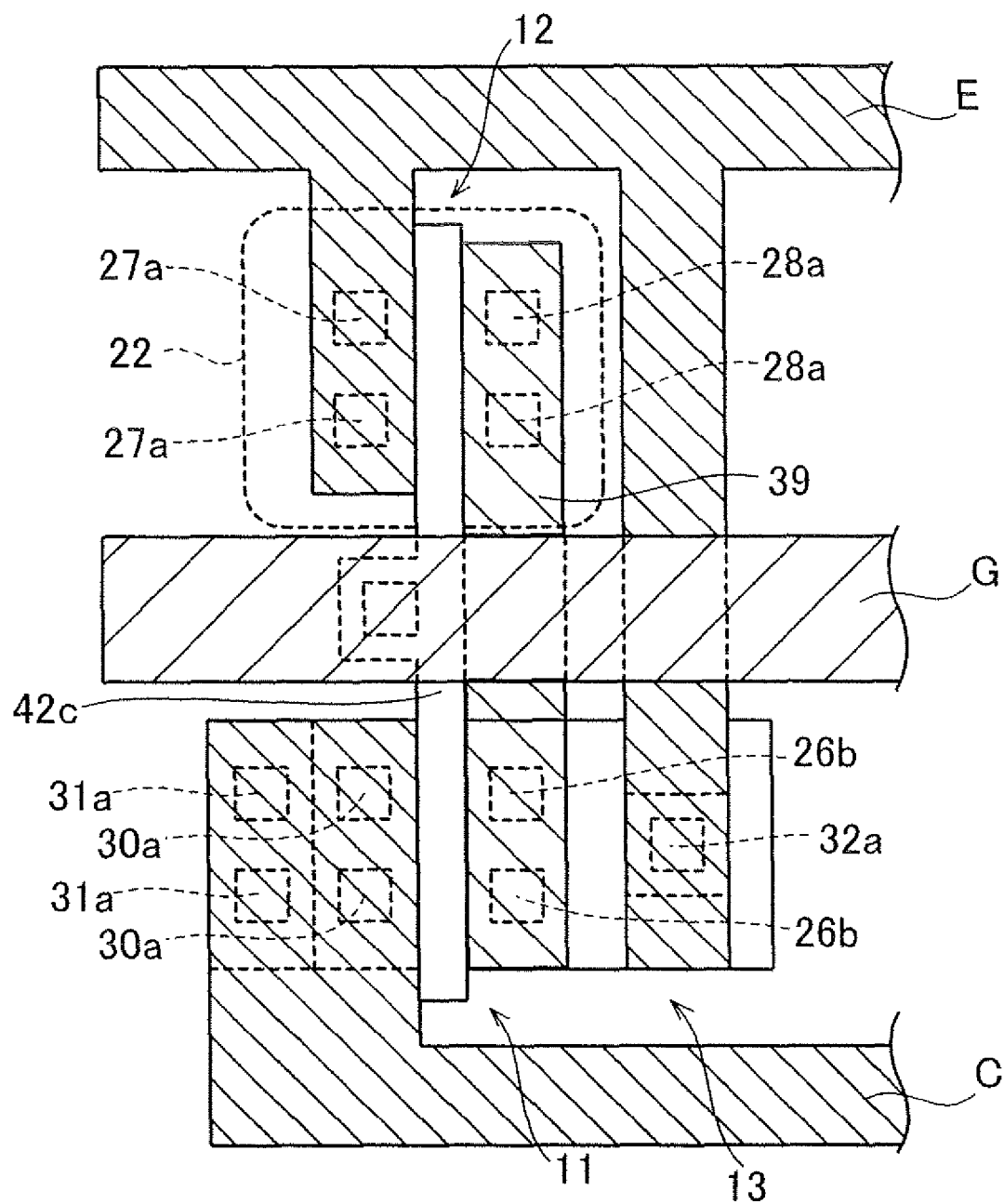
FIG. 25 is an electrode arrangement diagram of a semiconductor device according to a modification of the first embodiment of the present invention.
Figure 26:
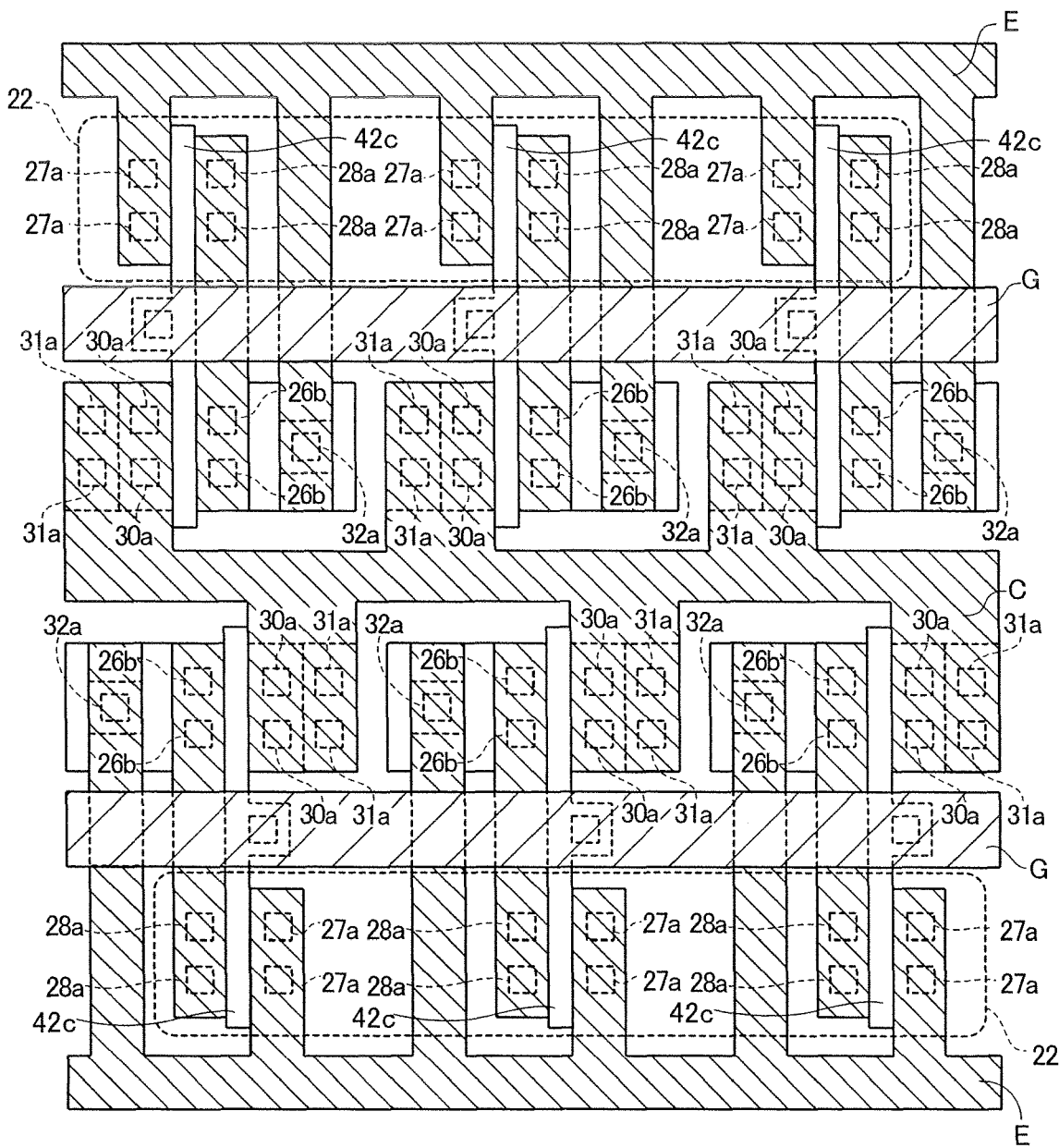
FIG. 26 is an electrode arrangement diagram when arranging the semiconductor devices according to the modification of the first embodiment of the present invention in the form of an array.

For example, as electrode arrangement, while the devices of the PMOSFET 12, the pnp bipolar transistor 13 and the NMOSFET 11 can be arranged in alignment with each other in plan view as shown in FIG. 3 in the aforementioned first embodiment, the present invention is not restricted to this but the PMOSFET 12 is so arranged as to be opposed to the NMOSFET 11 and the pnp bipolar transistor 13 with the gate terminal (G) therebetween, and the n⁺-type gate electrode 36 of the NMOSFET 11 and the p⁺-type gate electrode 35 of the PMOSFET 12 are connected by the same polysilicon gate 42c as shown in FIG. 25. Thus, pattern of each gate electrode and each impurity region can be simplified, and a process can be easily carried out. FIG. 26 shows cells of FIG. 25 arranged in the form of an array. When cells are arranged in the form of an array, collectors (C) can be rendered common. Thus, the cells are arranged in a turning pattern, and hence the devices can be integrated.

While the npn bipolar transistor 63 is turned on when the input signal (VG) received in the gate terminal (G) of the inverter 64 is low in each of the aforementioned seventh to tenth embodiments, the present invention is not restricted to this but another inverter may be added in a stage precedent to the inverter 64 shown in FIG. 20 so that the npn bipolar transistor 63 is turned on when the input signal (VG) received in the gate terminal (G) of the inverter 64 is high.

What is claimed is:

1. A semiconductor device comprising:
  a second conductivity type first semiconductor layer having a main surface;
  a first conductivity type first well formed in said second conductivity type first semiconductor layer and a top surface of said first conductivity type first well is separated from said main surface by an element isolation oxide film;
  a second conductivity type second field-effect transistor formed on said main surface and in said first conductivity type first well;
  a first conductivity type first field-effect transistor formed on said main surface outside of said first conductivity type first well;
  wherein said first conductivity type first field-effect transistor and said second conductivity type second field-effect transistor including sources, drains and gates electrodes respectively, said drains being connected to each other and said gate electrodes being connected to each other to form an inverter;
  a bipolar transistor formed on the main surface outside of said first conductivity type first well, wherein said bipolar transistor including a collector, a base and an emitter, said base receiving an output of said inverter;
  a first conductivity type first impurity region constituting said drain of said first conductive type first field-effect transistor and a first conductivity type second impurity region constituting said base of said bipolar transistor have different impurity concentrations from each other, said first conductivity type first impurity region and said first conductivity type second impurity region are so formed as to be in direct contact with each other, and the thickness of said first conductivity type first impurity region is smaller than the thickness of said first conductivity type second impurity region, wherein said first conductivity type first impurity region is so formed as to overlap with said first conductivity type second impurity region at a position closer to said base of said bipolar transistor than a central portion of said first conductivity type second impurity region,
  a second conductivity type third impurity region constituting said emitter of said bipolar transistor is separated from a first conductivity type fourth impurity region constituting said source of said first conductivity type first field-effect transistor by said first conductivity type first impurity region.

2. The semiconductor device according to claim 1, wherein said base of said bipolar transistor includes an intrinsic base layer, and the thickness of said intrinsic base layer of said bipolar transistor is smaller than the depths of said sources and said drains of said first conductivity type first field-effect transistor and said second conductivity type second field-effect transistor.

3. The semiconductor device according to claim 1, wherein all terminals of said gate electrodes, said sources and said drains of said first conductivity type first field-effect transistor and said second conductivity type second field-effect transistor and said collector, said base and said emitter of said bipolar transistor are formed on said main surface.

4. The semiconductor device according to claim 3, wherein said first conductivity type first field-effect transistor is formed between said base and said collector of said bipolar transistor on said second conductivity type first semiconductor layer.

5. The semiconductor device according to claim 1, further comprising:
  a metal silicide film formed on at least one of said main surface and surfaces of said gate electrodes of said first conductivity type field-effect transistor and said second conductivity type field-effect transistor, wherein said drain of said second conductivity type second field-effect transistor and said base of said bipolar transistor are electrically connected to each other with said metal silicide film formed on said main surface.

6. The semiconductor device according to claim 1, further comprising:
  a second conductivity type second well so formed as to cover said first conductivity type second impurity region constituting said base of said bipolar transistor; and
  a first conductivity type third well so formed as to cover said second conductivity type second well.

7. The semiconductor device according to claim 1, further comprising:
  a first conductivity type semiconductor substrate; and
  a second conductivity type first buried layer so formed between said first conductivity type semiconductor substrate and said second conductivity type first semiconductor layer below at least said first conductivity type first field-effect transistor and said bipolar transistor as to extend along a surface of said first conductivity type semiconductor substrate, wherein
  an impurity concentration of said second conductivity type first buried layer is higher than an impurity concentration of said second conductivity type first semiconductor layer.

8. The semiconductor device according to claim 7, wherein said second conductivity type first buried layer is formed over a whole area below said first conductivity type field-effect transistor, said second conductivity type field-effect transistor and said bipolar transistor.

9. The semiconductor device according to claim 7, further comprising:
a second conductivity type first collector extraction region constituting said collector of said bipolar transistor so formed as to have an impurity concentration higher than that of said second conductivity type first semiconductor layer; and
a second conductivity type second semiconductor region so formed as to connect said second conductivity type first collector extraction region and said second conductivity type first buried layer and have an impurity concentration higher than that of said second conductivity type first semiconductor layer.

10. The semiconductor device according to claim 1, wherein
said bipolar transistor is a pnp-type bipolar transistor,
said first conductivity type first field-effect transistor is a transistor having an n-type source and an n-type drain, and said first conductivity type first impurity region constituting said drain of said first conductivity type first field-effect transistor and said first conductivity type second impurity region constituting said base of said bipolar transistor are so formed as to be in direct contact with each other.

11. The semiconductor device according to claim 1, wherein
said bipolar transistor is an npn bipolar transistor,
said first conductivity type first field-effect transistor is a transistor having a p-type source and a p-type drain, and said first conductivity type first impurity region constituting said drain of said first conductivity type first field-effect transistor and said first conductivity type second impurity region constituting said base of said bipolar transistor are so formed as to be in direct contact with each other.

12. The semiconductor device according to claim 1, wherein
said first conductivity type first impurity region is so formed as to partially overlap with said first conductivity type second impurity region at a position closer to said base of said bipolar transistor than a center portion of said first conductivity type second impurity region.

13. The semiconductor device according to claim 1, wherein
said first conductivity type is an n-type, and
said second conductivity type is a p-type.

* * * * *